United States Patent
Emoto et al.

(10) Patent No.: US 10,224,198 B2
(45) Date of Patent: Mar. 5, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventors: Tetsuya Emoto, Kyoto (JP); Atsuro Eitoku, Kyoto (JP); Tomomi Iwata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/388,311

(22) Filed: Dec. 22, 2016

(65) Prior Publication Data
US 2017/0182515 A1 Jun. 29, 2017

(30) Foreign Application Priority Data
Dec. 25, 2015 (JP) ................. 2015-255046

(51) Int. Cl.
*H01L 21/02* (2006.01)
*H01L 21/67* (2006.01)
*H01L 21/687* (2006.01)

(52) U.S. Cl.
CPC .... *H01L 21/02057* (2013.01); *H01L 21/6708* (2013.01); *H01L 21/67028* (2013.01); *H01L 21/67051* (2013.01); *H01L 21/67109* (2013.01); *H01L 21/68792* (2013.01)

(58) Field of Classification Search
CPC ......... H01L 21/02057; H01L 21/67028; H01L 21/67109; H01L 21/67034; H01L 21/67051; B05D 1/005
USPC ........................................... 427/240
See application file for complete search history.

(56) References Cited

U.S. PATENT DOCUMENTS

| | | | |
|---|---|---|---|
| 2012/0160274 A1 | 6/2012 | Kasai et al. | 134/26 |
| 2014/0065295 A1 | 3/2014 | Emoto et al. | 427/8 |
| 2014/0127908 A1 | 5/2014 | Okutani | 438/694 |
| 2015/0090694 A1 | 4/2015 | Hashimoto et al. | 216/83 |
| 2015/0258553 A1 | 9/2015 | Kobayashi et al. | 427/372.2 |
| 2015/0279708 A1* | 10/2015 | Kobayashi | C23C 16/458 438/747 |

FOREIGN PATENT DOCUMENTS

| | | |
|---|---|---|
| JP | 2009-212301 | 9/2009 |
| JP | 2009-218456 A | 9/2009 |
| JP | 2014-090015 | 5/2014 |
| JP | 2014-112652 | 6/2014 |
| JP | 2014-197571 A | 10/2014 |
| TW | 201234454 A | 8/2012 |
| TW | 201340229 A | 10/2013 |
| TW | 201539627 A | 10/2015 |

* cited by examiner

*Primary Examiner* — Kirsten Jolley
(74) *Attorney, Agent, or Firm* — Ostrolenk Faber LLP

(57) ABSTRACT

A low surface tension liquid is supplied from a low surface tension liquid supplying unit to a heated substrate to replace a processing liquid by the low surface tension liquid. The heating of the substrate is weakened and the low surface tension liquid is supplied from the low surface tension liquid supplying unit to the substrate, so that a liquid film of the low surface tension liquid is formed. The liquid film on the substrate is removed by strengthening the heating of the substrate without supplying the low surface tension liquid from the low surface tension liquid supplying unit to a central region of the substrate.

10 Claims, 23 Drawing Sheets

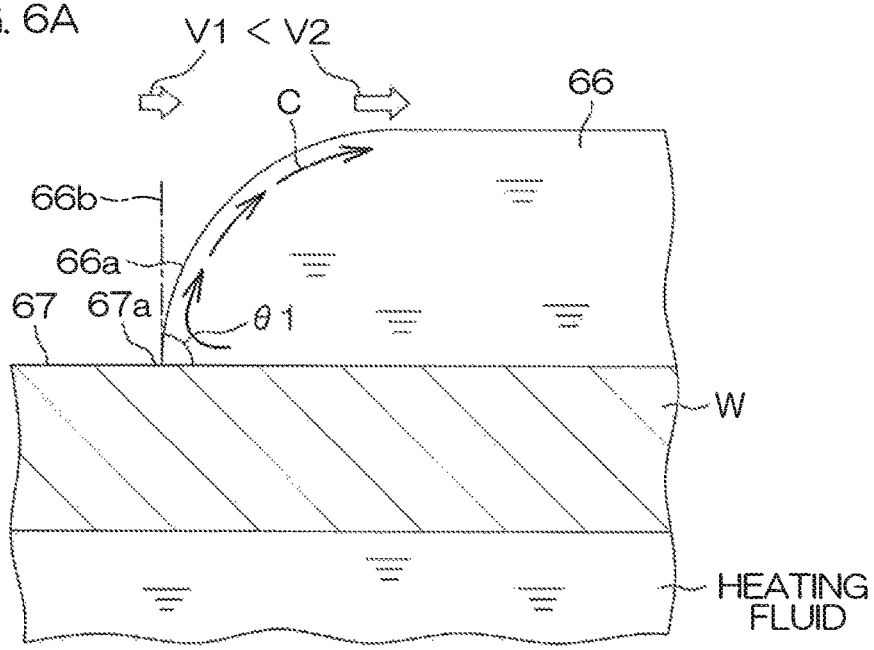
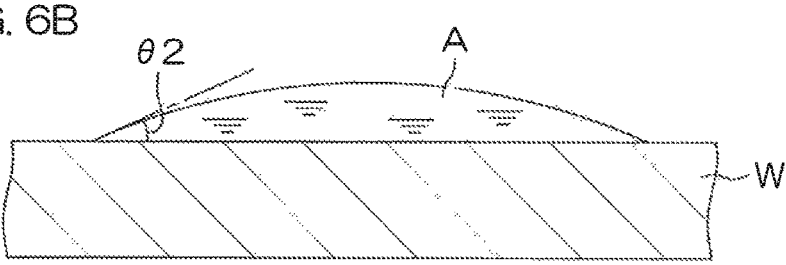

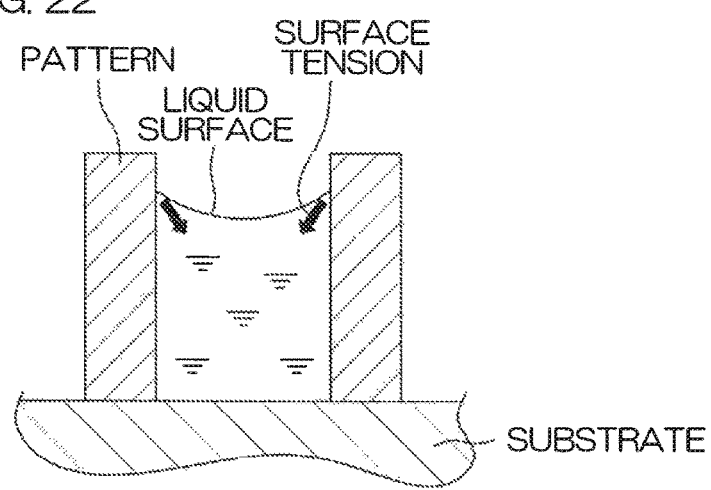

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for processing a substrate by a liquid. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus that processes a substrate one by one, for example, a chemical liquid is supplied to the substrate that is held substantially horizontally by a spin chuck. Thereafter, a rinse liquid is supplied to the substrate and the chemical liquid on the substrate is thereby replaced by the rinse liquid. Thereafter, a spin drying step is performed to remove the rinse liquid on the substrate.

As shown in FIG. 22, when a fine pattern is formed on a front surface of the substrate, it may not be possible to eliminate the rinse liquid, which has entered into an interior of the pattern, by the spin drying step and this may cause drying failure to occur. A liquid surface (an interface of air and liquid) of the rinse liquid that has entered into the interior of the pattern is formed inside the pattern and therefore surface tension of the liquid acts at positions of contact of the liquid surface and the pattern. When the surface tension is high, pattern collapse occurs readily. Water, which is a typical rinse liquid, is high in surface tension and therefore pattern collapse in the spin drying step cannot be neglected.

Therefore, in Japanese Patent Application Publication No. 2009-212301, it is proposed that isopropyl alcohol (IPA) is supplied to the front surface of the substrate while heating a substrate by supplying hot water to a rear surface of the substrate. IPA is a low surface tension liquid of which surface tension is lower than water. Water is thereby replaced by IPA and the IPA is thereafter eliminated from the substrate by spinning off the IPA by a centrifugal force.

SUMMARY OF THE INVENTION

With the method of Japanese Patent Application Publication No. 2009-212301, removal of IPA, as the low surface tension liquid, from the front surface of the substrate by the centrifugal force is attempted. However, it is difficult to completely eliminate the IPA, which has entered inside the fine pattern on the front surface of the substrate, by just the centrifugal force. With the method of Japanese Patent Application Publication No. 2009-212301, the substrate is heated by hot water. Therefore, before the IPA is eliminated by the centrifugal force, evaporation of the IPA on the front surface of the substrate does not occur uniformly but complete evaporation of IPA occurs locally and the substrate is exposed. A liquid droplet may thus remain partially on the front surface of the substrate. Until the liquid droplet evaporates completely, the liquid surface of IPA (that may in some cases contain a minute amount of moisture dissolved in the IPA) continues to apply a surface tension to the pattern. Pattern collapse may occur thereby.

Thus, an object of the present invention is to provide a substrate processing apparatus and a substrate processing method by which a low surface tension liquid on a front surface of a substrate can be removed satisfactorily.

The present invention provides a substrate processing apparatus including a substrate holding unit that holds a substrate horizontally, a processing liquid supplying unit that supplies a processing liquid which contains water, to the substrate held by the substrate holding unit, a low surface tension liquid supplying unit, that supplies a low surface tension liquid having a lower surface tension than water to the substrate held by the substrate holding unit, a substrate heating unit that heats the substrate held by the substrate holding unit, and a controller that controls the processing liquid supplying unit, the low surface tension liquid supplying unit, and the substrate heating unit. The controller is programmed to execute a processing liquid supplying step of making the processing liquid be supplied to the substrate by the processing liquid supplying unit, a replacing step of making the processing liquid be replaced by the low surface tension liquid which is supplied to the substrate from the low surface tension liquid supplying unit while heating the substrate by the substrate heating unit, a liquid film forming step of forming a liquid film of the low surface tension liquid on a front surface of the substrate by weakening the heating of the substrate by the substrate heating unit and by supplying the low surface tension liquid to the substrate from the low surface tension liquid supplying unit, and a liquid film removing step of removing the liquid film on the substrate by strengthening the heating of the substrate by the substrate heating unit without supplying the low surface tension liquid from the low surface tension liquid supplying unit to a central region of the substrate.

With the present arrangement, due to the substrate being heated, the processing liquid on the substrate is replaced efficiently by the low surface tension liquid. On the other hand, when the liquid film of the low surface tension liquid is formed, the heating of the substrate is weakened so that evaporation of the low surface tension liquid is suppressed. The liquid film of sufficient thickness is thus formed efficiently. Splitting of the liquid film due to localized evaporation of the low surface tension liquid can thereby be suppressed. By then strengthening the heating of the substrate again without supplying the low surface tension liquid to the central region of the substrate, the liquid film can be removed from the front surface of the substrate in a mass state without splitting. The low surface tension liquid on the front surface of the substrate can thus be removed satisfactorily without leaving a liquid droplet of the low surface tension liquid on the front surface of the substrate.

In the preferred embodiment of the present invention, in the liquid film removing step, the controller is programmed to control the substrate heating unit to generate a convection in the liquid film of the low surface tension liquid and to remove the liquid film from the front surface of the substrate by the movement of the liquid film due to the convection.

With the present arrangement, the processing liquid is replaced efficiently by the low surface tension liquid by the substrate being heated. Also, by control of the heating of the substrate, the convection that makes the liquid film move is generated inside the liquid film of the low surface tension liquid so that spontaneous movement of the liquid film is generated by the convection, and the liquid film is thereby removed from the front surface of the substrate. Consequently, the liquid film can be removed from the front surface of the substrate in a mass state without splitting. The low surface tension liquid on the front surface of the substrate can thus be removed satisfactorily without leaving a liquid droplet of the low surface tension liquid on the front surface of the substrate.

In accordance with another aspect, the present invention provides a substrate processing apparatus including a substrate holding unit that holds a substrate horizontally, a processing liquid supplying unit that supplies a processing liquid which contains water, to the substrate held by the substrate holding unit, a low surface tension liquid supplying unit, that supplies a low surface tension liquid having a lower surface tension than water to the substrate held by the substrate holding unit, a substrate heating unit that heats the substrate held by the substrate holding unit, and a controller that controls the processing liquid supplying unit, the low surface tension liquid supplying unit, and the substrate heating unit, wherein the controller is programmed to execute a processing liquid supplying step of making the processing liquid be supplied to the substrate by the processing liquid supplying unit, a replacing step of making the processing liquid be replaced by the low surface tension liquid which is supplied to the substrate from the low surface tension liquid supplying unit while heating the substrate by the substrate heating unit, a liquid film forming step of forming a liquid film of the low surface tension liquid on a front surface of the substrate by supplying the low surface tension liquid to the substrate from the low surface tension liquid supplying unit, and a liquid film removing step of removing the liquid film on the substrate by controlling the substrate heating unit to generate a convection in the liquid film of the low surface tension liquid and to remove the liquid film from the front surface of the substrate by the movement of the liquid film due to the convection.

In the preferred embodiment of the present invention, the liquid film removing step includes an opening forming step of forming an opening in a central region of the liquid film of the low surface tension liquid and an opening enlarging step of heating the substrate by the substrate heating unit so that the convection in a direction away from the substrate is generated at a gas-liquid interface of the liquid film positioned at a peripheral edge of the opening, thereby spreading the opening to a peripheral edge of the substrate.

With the present arrangement, the convection in the direction away from the substrate is generated at the gas-liquid interface of the liquid film at the peripheral edge of the opening formed in the central region of the liquid film of the low surface tension liquid. The convection gives rise to spontaneous movement in the direction of spreading the opening and the opening is thereby enlarged. The low surface tension liquid can thus be removed even more satisfactorily from the front surface of the substrate without splitting the liquid film.

The gas-liquid interface of the liquid film positioned at the peripheral edge of the opening may be in contact with the front surface of the substrate at a larger angle than a contact angle of the low surface tension liquid with respect to the front surface of the substrate. Such a state is entered when spontaneous movement of the liquid film due to convention generated in the liquid film is occurring. More specifically, the gas-liquid interface of the liquid film positioned at the peripheral edge of the opening may be in contact with the front surface of the substrate at an angle of not less than 45 degrees. A centrifugal force may be acting on the liquid film due to rotation of the substrate or a blowing force due to a gas may be acting on the opening peripheral edge of the liquid film due to supplying of the gas into the opening. Even in such a case, it is preferable for the gas-liquid interface of the liquid film at the opening peripheral edge to be in contact with the front surface of the substrate at an angle greater than the contact angle of the low surface tension liquid with respect to the substrate (for example, an angle of not less than 45 degrees). If this is so, it may be said that a dominant mechanism for movement of the liquid film (for example, enlargement of the opening) is the spontaneous movement due to the convection inside the liquid film.

In the preferred embodiment of the present invention, the substrate processing apparatus further includes a liquid landing position changing unit that changes a liquid landing position on the front surface of the substrate of the low surface tension liquid supplied from the low surface tension liquid supplying unit. The controller is programmed to control the liquid landing position changing unit to move the liquid landing position in accordance with the enlargement of the opening, so that the liquid landing position is positioned further outside than the peripheral edge of the opening after the opening has been formed in the liquid film of the low surface tension liquid.

With the present arrangement, the low surface tension liquid is sufficiently supplied further outside than the peripheral edge of the opening. Splitting of the liquid film due to localized evaporation of the low surface tension liquid further outside than the peripheral edge of the opening is thus suppressed further. The low surface tension liquid on the front surface of the substrate can thus be removed even more satisfactorily.

In the preferred embodiment of the present invention, the substrate heating unit includes a heating position moving unit that moves a heating position in accordance with a movement of the peripheral edge of the opening formed in the liquid film of the low surface tension liquid. With the present arrangement, the heating position moves in accordance with the movement of the peripheral edge of the opening. A convection can thus be generated satisfactorily at the gas-liquid interface of the liquid film positioned at the peripheral edge of the opening. The low surface tension liquid on the front surface of the substrate can thus be removed even more satisfactorily.

In the preferred embodiment of the present invention, the substrate processing apparatus further includes a substrate rotating unit rotates the substrate held by the substrate holding unit around a predetermined rotational axis oriented along a vertical direction. The controller is further programmed to control the substrate rotating unit to rotate the substrate in the replacing step, to decelerate the rotation of the substrate in the liquid film forming step, and to rotate the substrate in the liquid film removing step at a lower speed than a rotational speed in the replacing step.

With the present arrangement, in the replacing step, the low surface tension liquid is supplied to the front surface of the substrate while the processing liquid is being removed by a centrifugal force generated by the rotation of the substrate, and therefore the processing liquid on the substrate can be replaced by the low surface tension liquid with good efficiency. In the liquid film forming step, an amount of the low surface tension liquid removed from the substrate is reduced by reducing the centrifugal force by decelerating the rotation of the substrate, and therefore the liquid film can be formed satisfactorily. In the liquid film removing step, the substrate is rotated at a lower speed than the rotational speed in the replacing step, and therefore the state in which the spontaneous movement of the liquid film due to heating is dominant is entered. The spontaneous movement of the liquid film can thus be aided by an appropriate centrifugal force.

In the preferred embodiment of the present invention, in the liquid film removing step, the controller is programmed to control the heating of the substrate by the substrate heating unit and the rotation of the substrate by the substrate rotating unit so that a movement speed of the liquid film due to the convection inside the liquid film is higher than a movement speed of the liquid film due to the centrifugal force acting on the liquid film.

With the present arrangement, the spontaneous movement speed of the liquid film due to the convection inside the liquid film is higher than the movement speed of the liquid film due to the centrifugal force acting on the liquid film, and therefore the amount of the low surface tension liquid removed from the substrate by the centrifugal force can be suppressed. Splitting of the liquid film on the substrate can thereby be suppressed further. The low surface tension liquid on the front surface of the substrate can thus be removed even more satisfactorily.

In the preferred embodiment of the present invention, in the liquid film removing step, the controller is programmed to maintain fixed the rotational speed of the substrate or change the rotational speed of the substrate within a speed range in which the liquid film does not split on the substrate. With the present arrangement, the substrate rotates within the speed range in which the liquid film does not split on the substrate. The movement of the liquid film is thus aided by the centrifugal force and the liquid film is removed off the substrate while being kept in a liquid mass state.

In the preferred embodiment of the present invention, the substrate heating unit includes a center hot water supplying unit that supplies hot water to a rear surface center of the substrate. With the present arrangement, by supplying hot water toward the rear surface center of the substrate, evaporation of the low surface tension liquid of the liquid film at a vicinity of a center of the substrate is promoted and an onset point of the convection inside the liquid film is disposed at the vicinity of the center of the substrate. The opening can thereby be formed in the liquid film at the center of the substrate, that is, at a vicinity of a center of the liquid film. By then making the liquid film move so as to spread the opening to the outside, the liquid film can be removed off the substrate.

In the preferred embodiment of the present invention, the substrate heating unit further includes an outer peripheral portion heating unit that heats the substrate at an outer peripheral position away from the center of the substrate. With the present arrangement, the evaporation of the low surface tension liquid at the outer peripheral position can be promoted by heating the substrate at the outer peripheral position, and the liquid film can thus be removed efficiently.

In the preferred embodiment of the present invention, the substrate heating unit includes an annular region heating unit that heats an annular region ranging from a predetermined position away from the center of the substrate to an outer periphery of the substrate.

With the present arrangement, by heating the annular region ranging from the predetermined position away from the center of the substrate to the outer periphery of the substrate, the entire substrate can be heated evenly and therefore the convection inside the liquid film is maintained. The liquid film can thus be removed efficiently by the spontaneous movement of the liquid film due to the heating.

The low surface tension liquid supplying unit may supply a low surface tension liquid that is lower in temperature than the substrate. The convection inside the liquid film is thereby generated more readily by a temperature difference with respect to the substrate. More specifically, the temperature of the low surface tension liquid is preferably lower than the temperature of the substrate at a vicinity of the position of heating by the substrate heating unit. The convection directed from the substrate to the front surface of the liquid film can thereby be generated and promoted at the vicinity of the heating position, and therefore the liquid film can be removed efficiently off the substrate by the spontaneous movement of the liquid film on the substrate.

A preferred embodiment of the present invention provides a substrate processing method including a processing liquid supplying step of supplying a processing liquid which contains water, to a horizontally held substrate, a replacing step of replacing the processing liquid by supplying a low surface tension liquid, having a surface tension lower than water, to the substrate while heating the substrate, a liquid film forming step of forming a liquid film of the low surface tension liquid, which has the surface tension lower than water, on a front surface of the substrate, by weakening the heating of the substrate and supplying the low surface tension liquid to the substrate, and a liquid film removing step of removing the liquid film on the substrate by strengthening the heating of the substrate without supplying the low surface tension liquid to a central region of the substrate.

With the present method, the processing liquid on the substrate is replaced efficiently by the low surface tension liquid by the substrate being heated. On the other hand, when the liquid film of the low surface tension liquid is formed, the heating of the substrate is weakened so that evaporation of the low surface tension liquid is suppressed. The liquid film of sufficient thickness is thus formed efficiently. Splitting of the liquid film due to localized evaporation of the low surface tension liquid can thereby be suppressed. Then by strengthening the heating of the substrate again without supplying the low surface tension liquid to the central region of the substrate, the liquid film can be removed from the front surface of the substrate in a mass state without splitting. The low surface tension liquid on the front surface of the substrate can thus be removed satisfactorily without leaving a liquid droplet of the low surface tension liquid on the front surface of the substrate.

A preferred embodiment of the present invention provides a substrate processing method including a processing liquid supplying step of supplying a processing liquid which contains water, to a horizontally held substrate, a replacing step of replacing the processing liquid by supplying a low surface tension liquid, having a surface tension lower than water, to the substrate while heating the substrate, a liquid film forming step of forming, a liquid film of the low surface tension liquid, which has the surface tension lower than water, on a front surface of the substrate, by supplying the low surface tension liquid to the substrate, and a liquid film removing step of heating the substrate to generate a convection inside the liquid film of the low surface tension liquid having the surface tension lower than water to remove the liquid film from the front surface of the substrate by movement of the liquid film due to the convection.

With the present method, the processing liquid is replaced efficiently by the low surface tension liquid by the substrate being heated. Also, by control of the heating of the substrate, the convection that makes the liquid film move is generated inside the liquid film of the low surface tension liquid so that spontaneous movement of the liquid film is generated by the convection, and the liquid film is thereby removed from the front surface of the substrate. Consequently, the liquid film can be removed from the front surface of the substrate in a mass state without splitting. The low surface tension liquid on the front surface of the substrate can thus be removed satisfactorily without leaving a liquid droplet of the low surface tension liquid on the front surface of the substrate.

In the preferred embodiment of the present invention, the liquid film removing step includes an opening forming step of forming an opening in a central region of the liquid film of the low surface tension liquid and an opening enlarging step of heating the substrate so that a convection in a direction away from the substrate is generated at a gas-liquid interface of the liquid film positioned at a peripheral edge of the opening, thereby spreading the opening to a peripheral edge of the substrate.

With the present method, the convection in the direction away from the substrate is generated at the gas-liquid interface of the liquid film at the peripheral edge of the opening formed in the central region of the liquid film of the low surface tension liquid. The convection gives rise to spontaneous movement in the direction of spreading the opening. The opening is thereby enlarged. The low surface tension liquid can thus be removed even more satisfactorily from the front surface of the substrate without splitting the liquid film.

In the preferred embodiment of the present invention, the substrate processing method further includes a liquid landing position changing step of performing, in parallel to the opening enlarging step, supplying of the low surface tension liquid, having the surface tension lower than water, to a liquid landing position set further outside than the peripheral edge of the opening on the front surface of the substrate and changing of the liquid landing position in accordance with the enlargement of the opening.

With the present method, the low surface tension liquid is sufficiently supplied further outside than the peripheral edge of the opening. Splitting of the liquid film due to localized evaporation of the low surface tension liquid further outside than the peripheral edge of the opening is thus suppressed. The low surface tension liquid on the front surface of the substrate can thus be removed even more satisfactorily.

In the preferred embodiment of the present invention, the substrate processing method further includes a substrate rotating step of rotating the substrate around a predetermined rotational axis oriented along a vertical direction in the replacing step, decelerating the rotation of the substrate around the rotational axis in the liquid film forming step, and rotating the substrate around the rotational axis in the liquid film removing step at a lower speed than a rotational speed in the replacing step.

With the present method, in the replacing step, the low surface tension liquid is supplied to the front surface of the substrate while the processing liquid is removed by a centrifugal force generated by the rotation of the substrate, and therefore the processing liquid on the substrate can be replaced by the low surface tension liquid with good efficiency. In the liquid film forming step, an amount of the low surface tension liquid removed from the substrate is reduced by reducing the centrifugal force by decelerating the rotation of the substrate, and therefore the liquid film can be formed satisfactorily. In the liquid film removing step, the substrate is rotated at a lower speed than the rotational speed in the replacing step, and therefore the state in which the spontaneous movement of the liquid film due to heating is dominant is entered. The spontaneous movement of the liquid film can thus be aided by an appropriate centrifugal force.

In the preferred embodiment of the present invention, in the liquid film removing step, the substrate is heated and rotated so that a movement speed of the liquid film due to the convection inside the liquid film is higher than a movement speed of the liquid film due to the centrifugal force acting on the liquid film.

With the present method, the spontaneous movement speed of the liquid film due to the convection inside the liquid film is higher than the movement speed of the liquid film due to the centrifugal force acting on the liquid film, and therefore the amount of the low surface tension liquid removed from the substrate by the centrifugal force can be suppressed. Splitting of the liquid film on the substrate can thereby be suppressed further. The low surface tension liquid on the front surface of the substrate can thus be removed even more satisfactorily.

In the preferred embodiment of the present invention, by the substrate rotating step in the liquid film removing step, the rotational speed of the substrate is maintained fixed or the rotational speed of the substrate is changed within a speed range in which the liquid film does not split on the substrate.

With the present method, the substrate rotates within the speed range in which the liquid film does not split on the substrate. The movement of the liquid film is thus aided by the centrifugal force and the liquid film is removed off the substrate while being kept in a liquid mass state.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A is a schematic diagram of a vicinity of a peripheral edge of an opening in an opening enlarging step.

FIG. 6B is a schematic view of a vicinity of a liquid droplet of an organic solvent dropped onto a front surface of a substrate in a non-rotating state.

FIG. 22 is a schematic sectional view for describing principles of pattern collapse due to surface tension.

DETAILED DESCRIPTION OF THE PREFERRED EMBODIMENTS

First Preferred Embodiment

Figure 1:
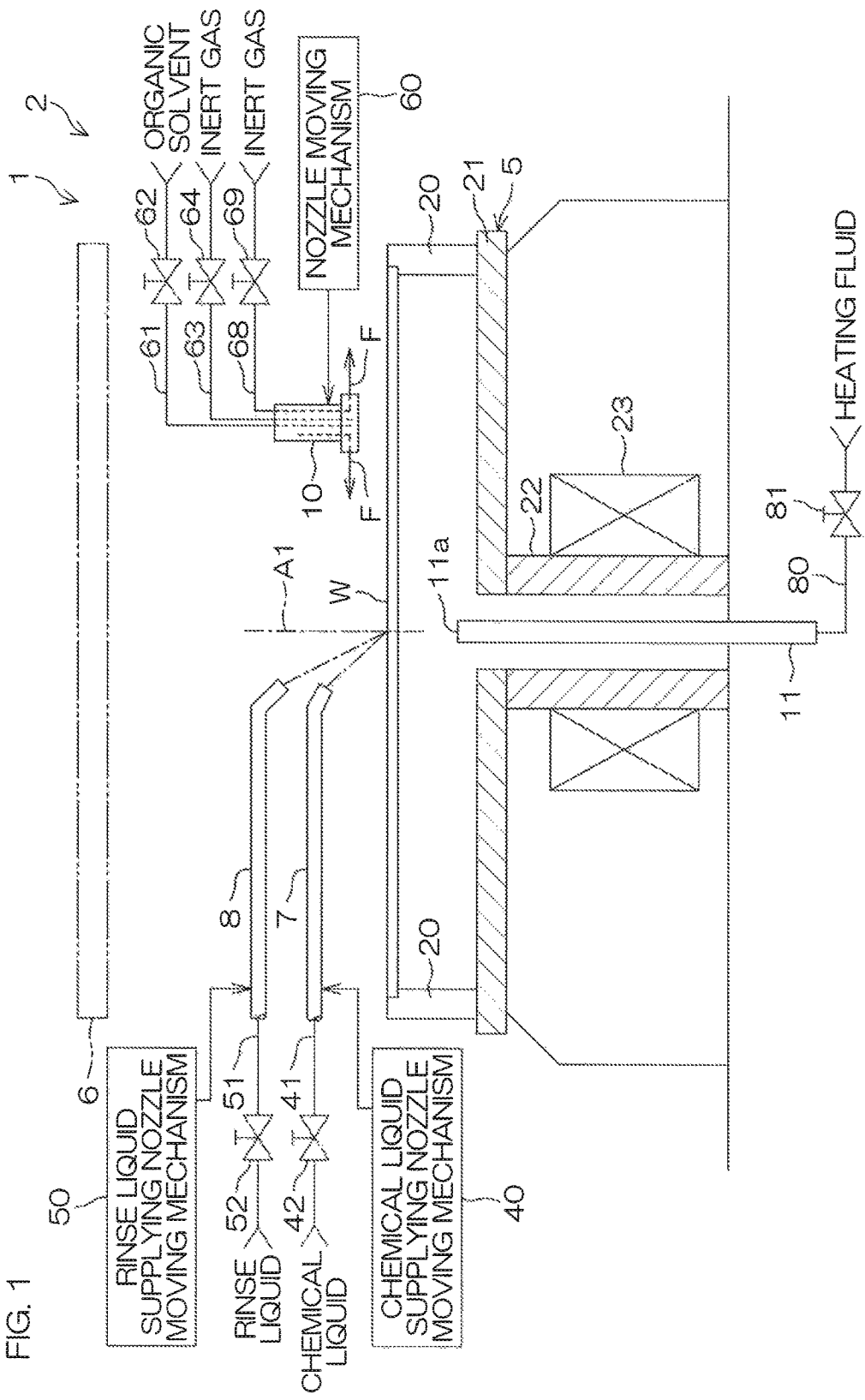
FIG. 1 is a schematic sectional view for describing an arrangement example of a processing unit included in a substrate processing apparatus according to a first preferred embodiment of the present invention.

FIG. 1 is a schematic sectional view for describing an arrangement example of a processing unit 2 included in a substrate processing apparatus 1 according to a first preferred embodiment of the present invention. The substrate processing apparatus 1 is a single substrate processing type apparatus that processes a substrate W, such as a silicon wafer, one by one. In the present preferred embodiment, the substrate W is a circular substrate. A fine pattern (see FIG. 22) is formed on a front surface of the substrate W. The substrate processing apparatus 1 includes the processing unit 2 that processes the substrate W using a liquid. Besides the processing unit 2, the substrate processing apparatus 1 may include a transfer robot (not shown) arranged to carry the substrate W into the processing unit 2 and carry out the substrate W from the processing unit 2. The substrate processing apparatus 1 may include a plurality of the processing units 2.

The processing unit 2 includes a spin chuck 5 holding a single substrate W in a horizontal orientation and rotating the substrate W around a vertical rotational axis A1 passing through a center of the substrate W. The processing unit 2 further includes a chemical liquid supplying nozzle 7, supplying a chemical liquid, such as hydrofluoric acid, to the front surface (upper side major surface) of the substrate W held by the spin chuck 5, and a rinse liquid supplying nozzle 8, supplying a rinse liquid to the front surface of the substrate W held by the spin chuck 5. The rinse liquid supplying nozzle 8 is included in a processing liquid supplying unit that supplies a processing liquid that includes water.

The spin chuck 5 includes chuck pins 20, a spin base 21, a rotating shaft 22, and a substrate rotation driving mechanism 23 that rotates the substrate W around the rotational axis A1. The chuck pins 20 and the spin base 21 are included in a substrate holding unit that holds the substrate W horizontally. The rotating shaft 22 and the substrate rotation driving mechanism 23 are included in a substrate rotating unit by which the substrate W, held by the chuck pins 20 and the spin base 21, is rotated around the rotational axis A1.

The rotating shaft 22 extends in a vertical direction along the rotational axis A1. The rotating shaft 22 is a hollow shaft in the present preferred embodiment. An upper end of the rotating shaft 22 is coupled to a center of a lower surface of the spin base 21. The spin base 21 has a disk shape along a horizontal direction. The plurality of chuck pins 20, arranged to grip the substrate W, are disposed at intervals in a circumferential direction at a peripheral edge portion of an upper surface of the spin base 21. The substrate rotation driving mechanism 23 includes, for example, an electric motor that rotates the substrate W, the chuck pins 20, the spin base 21, and the rotating shaft 22 integrally around the rotational axis A1 by applying a rotational force to the rotating shaft 22.

The chemical liquid supplying nozzle 7 is moved, for example, in the horizontal direction (direction perpendicular to the rotational axis A1) by a chemical liquid supplying nozzle moving mechanism 40. The chemical liquid supplying nozzle 7 is capable of moving in the horizontal direction between a central position of facing a rotation center position of the front surface of the substrate W and a retracted position of not facing the front surface of the substrate W. The rotation center position of the front surface of the substrate W is a position on the front surface of the substrate W that intersects the rotational axis A1. The retracted position not facing the front surface of the substrate W is a position at an outer side of the spin base 21 in plan view. A chemical liquid supply pipe 41 is coupled to the chemical liquid supplying nozzle 7. The chemical liquid supply pipe 41 has interposed therein a chemical liquid valve 42 that opens and closes a flow passage thereof.

The chemical liquid supplied to the chemical liquid supplying nozzle 7 is not restricted to hydrofluoric acid and may be a liquid including at least one among sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, a corrosion inhibitor.

The rinse liquid supplying nozzle 8 is moved, for example, in the horizontal direction (direction perpendicular to the rotational axis A1) by a rinse liquid supplying nozzle moving mechanism 50. The rinse liquid supplying nozzle 8 is capable of moving in the horizontal direction between a central position of facing the rotation center position of the front surface of the substrate W and a retracted position of not facing the front surface of the substrate W. A rinse liquid supply pipe 51 is coupled to the rinse liquid supplying nozzle 8. The rinse liquid supply pipe 51 has interposed therein a rinse liquid valve 52 that opens and closes a flow passage thereof.

A rinse liquid supplied to the rinse liquid supplying nozzle 8 is, for example, deionized water (DIW). However, the rinse liquid is not restricted to deionized water and may instead be any of carbonated water, electrolyzed ion water, hydrogen water, ozone water, or aqueous hydrochloric acid solution of dilute concentration (of, for example, approximately 10 to 100 ppm).

The processing unit 2 further includes a moving nozzle 10, capable of moving above the substrate W, and a heating fluid supplying nozzle 11, supplying a heating fluid for heating the substrate W held by the spin chuck 5. The heating fluid supplying nozzle 11 is included in a substrate heating unit that heats the substrate W held by the chuck pins 20 and the spin base 21.

The moving nozzle 10 is moved in the horizontal direction (direction perpendicular to the rotational axis A1) and the vertical direction (direction parallel to the rotational axis A1) by a nozzle moving mechanism 60. The moving nozzle 10 is capable of moving in the horizontal direction between a central position of facing the rotation center position of the front surface of the substrate W and a retracted position of not facing the front surface of the substrate W. The nozzle moving mechanism 60 includes, for example, a pivoting shaft oriented along the vertical direction, a nozzle arm coupled to the pivoting shaft and extending horizontally, and an arm driving mechanism driving the nozzle arm. The arm driving mechanism includes a motor that swings the nozzle arm by making the pivoting shaft pivot around a vertical pivoting axis and an air cylinder that moves the nozzle arm vertically by elevating/lowering the pivoting shaft along the vertical direction. The moving nozzle 10 is fixed to the nozzle arm. The moving nozzle 10 moves in the horizontal direction and the perpendicular direction in accordance with the swinging and elevating/lowering of the nozzle arm.

In the present preferred embodiment, the moving nozzle 10 is included in a low surface tension liquid supplying unit that supplies an organic solvent, which is an example of a low surface tension liquid of which surface tension is lower than water, to the front surface of the substrate W held by the spin chuck 5.

IPA can be cited as an example of the organic solvent. The low surface tension liquid is not restricted to IPA and an organic solvent, besides IPA, that is lower in surface tension than water and does not react chemically with the front surface of the substrate W and the pattern (see FIG. 22) formed on the substrate W may be used. Specifically, a liquid including at least one among IPA, HFE (hydrofluoroether), methanol, ethanol, acetone, and trans-1,2 dichloroethylene may be used as the low surface tension liquid. The low surface tension liquid is not required to be constituted of just a single component and may be a liquid mixed with another component. For example, the low surface tension liquid may be a mixed liquid of an IPA liquid and pure water or a mixed liquid of an IPA liquid and an HFE liquid.

Also in the present preferred embodiment, the moving nozzle 10 is included in an inert gas supplying unit that supplies an inert gas, such as nitrogen gas ($N_2$), toward the front surface of the substrate W. The moving nozzle 10 is capable of supplying the inert gas to a position of the front surface of the substrate W below the moving nozzle 10. The moving nozzle 10, in a state of being positioned at the central position, is capable of supplying the inert gas toward the center of the substrate W. The moving nozzle 10 is capable of discharging the inert gas not only toward the position below the moving nozzle 10 but also toward an outer periphery away from the center of the substrate W. An inert gas flow F that covers the front surface of the substrate W and flows along the front surface of the substrate W is thereby formed. The outer periphery of the substrate W is a portion of the substrate W that is slightly further to an inner side (center side) than a peripheral edge of the substrate W. The moving nozzle 10 is thus included in an inert gas flow forming unit that discharges the inert gas toward the outer periphery of the substrate W and forms the inert gas flow F.

The inert gas is not restricted to nitrogen gas and suffices to be a gas that is inert with respect to the front surface of the substrate W and the pattern. The inert gas may, for example, be a noble gas, such as argon.

An organic solvent supply pipe 61, a first inert gas supply pipe 63, and a second inert gas supply pipe 68 are coupled to the moving nozzle 10. The organic solvent supply pipe 61 has interposed therein an organic solvent valve 62 that opens and closes a flow passage thereof. The first inert gas supply pipe 63 has interposed therein a first inert gas valve 64 that opens and closes a flow passage thereof. The second inert gas supply pipe 68 has interposed therein a second inert gas valve 69. An organic solvent from an organic solvent supply source is supplied to the organic solvent supply pipe 61. Inert gases from inert gas supply sources are supplied to the first inert gas supply pipe 63 and the second inert gas supply pipe 68.

The heating fluid supplying nozzle 11 supplies the heating fluid toward a center of a rear surface (lower side major surface) of the substrate W to heat the substrate W. The heating fluid supplying nozzle 11 is inserted through the rotating shaft 22. The heating fluid supplying nozzle 11 has, at an upper end, a discharge port 11a facing the center of the rear surface of the substrate W. A central region of the substrate W is heated in particular by the supplying of the heating fluid to the center of the rear surface of the substrate W. A heating fluid from a heating fluid supply source is supplied via a heating fluid supply pipe 80 to the heating fluid supplying nozzle 11. The heating fluid supplied is, for example, hot water. Hot water is water of higher temperature than room temperature and is, for example, water of 80° C. to 85° C. The heating fluid is not restricted to hot water and may be a gas, such as high temperature nitrogen gas. The heating fluid suffices to be a fluid capable of heating the substrate W. If the heating fluid is hot water, the heating fluid supplying nozzle 11 is included in a center hot water supplying unit that supplies the hot water to the rear surface center of the substrate W. The heating fluid supply pipe 80 has interposed therein a heating fluid valve 81 that opens and closes a flow passage thereof.

As indicated by alternate long and two short dashes lines in FIG. 1, the processing unit 2 may include a shielding plate 6 as a facing member facing the substrate W and arranged to shield (separate) an atmosphere between itself and the substrate W from an atmosphere of a periphery. The shielding plate 6 is formed to a disk shape having substantially the same diameter as or a diameter not less than the substrate W and is disposed substantially horizontally above the spin chuck 5. The shielding plate 6 is capable of moving to any position (height) from a lower position to an upper position. When the shielding plate 6 is at a position sufficiently close to the front surface of the substrate W, an interval between the shielding plate 6 and the substrate W is separated from the atmosphere of the periphery (exterior of a space between the shielding plate 6 and the substrate W) by the shielding plate 6.

Figure 2:
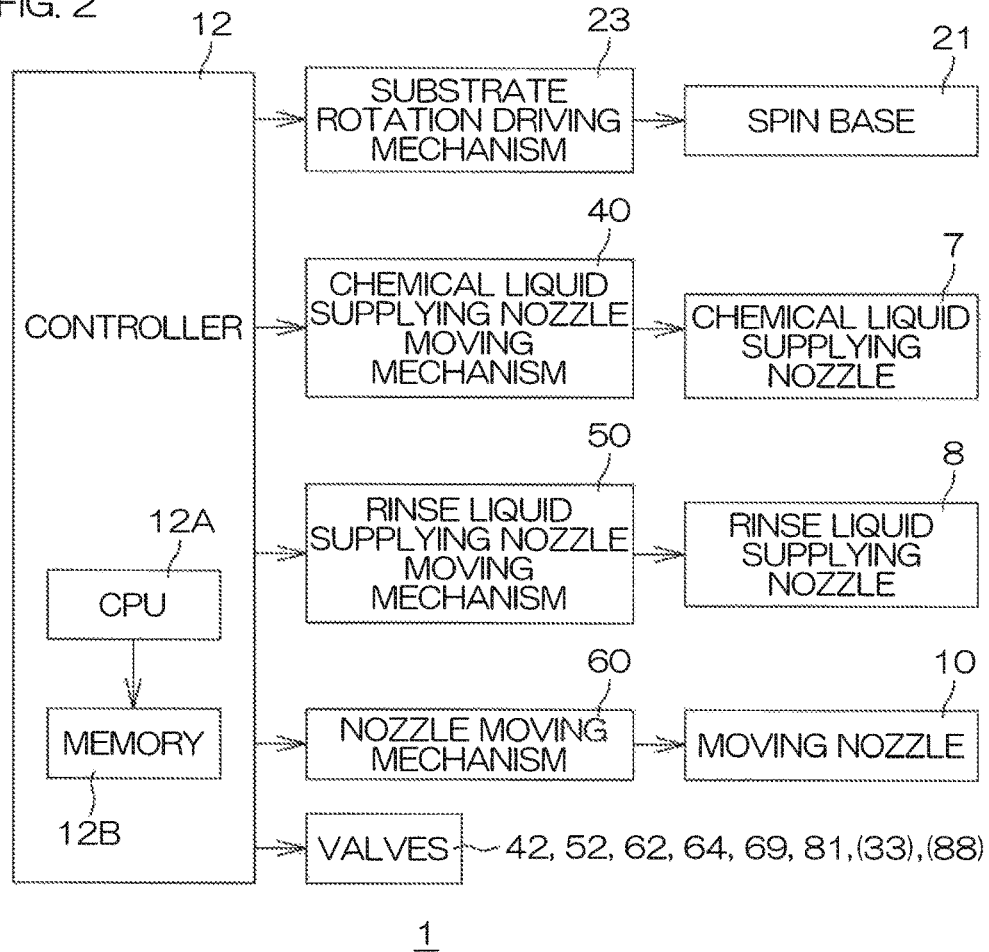
FIG. 2 is a block diagram for describing the electrical arrangement of a main portion of the substrate processing apparatus.

FIG. 2 is a block diagram for describing the electrical arrangement of a main portion of the substrate processing apparatus 1. The substrate processing apparatus 1 includes a controller 12. The controller 12 includes a microcomputer and controls control objects included in the substrate processing apparatus 1 in accordance with a predetermined control program. The controller 12 includes a processor (CPU) 12A and a memory 12B in which the control program is stored. The controller 12 is arranged to execute various controls for substrate processing by the processor 12A executing the control program. In particular, the controller 12 is programmed to control the substrate rotation driving mechanism 23, the chemical liquid supplying nozzle moving mechanism 40, the rinse liquid supplying nozzle moving mechanism 50, the nozzle moving mechanism 60, and the valves 42, 52, 62, 64, 69, and 81.

Figure 3:
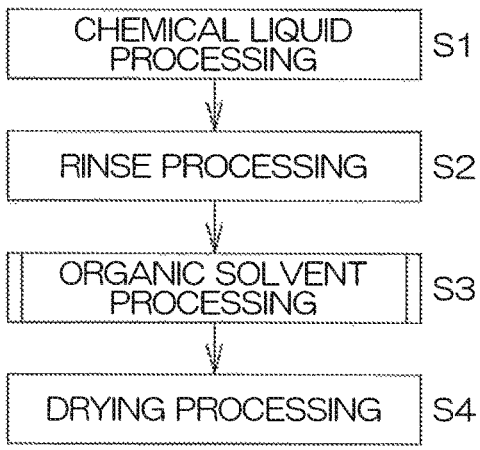
FIG. 3 is a flow diagram for describing an example of substrate processing performed by the processing unit.

FIG. 3 is a flow diagram for describing an example of substrate processing performed by the processing unit 2.

In the substrate processing by the processing unit 2, first, a chemical liquid processing step is executed (step S1). In the chemical liquid processing step, first, the controller 12 drives the substrate rotation driving mechanism 23 to rotate the spin base 21. The rotation of the substrate W is thereby started. In the chemical liquid processing step, the spin base 21 is rotated at a predetermined chemical liquid rotational speed. The chemical liquid rotational speed is, for example, 800 rpm to 1000 rpm.

The controller 12 then controls the chemical liquid supplying nozzle moving mechanism 40 to dispose the chemical liquid supplying nozzle 7 at a chemical liquid processing position above the substrate W. The chemical liquid processing position may be a position at which the chemical liquid discharged from the chemical liquid supplying nozzle 7 can land on the rotation center position of the front surface of the substrate W. The controller 12 then opens the chemical liquid valve 42. The chemical liquid is thereby supplied from the chemical liquid supplying nozzle 7 toward the front surface of the substrate W in the rotating state. The supplied chemical liquid spreads across the entire front surface of the substrate W due to a centrifugal force.

After the chemical liquid processing of a fixed time, a rinse processing step of replacing the chemical liquid on the front surface of the substrate W by the rinse liquid to remove the chemical liquid from the substrate W is executed (step S2).

Specifically, the controller 12 controls the rinse liquid supplying nozzle moving mechanism 50 to dispose the rinse liquid supplying nozzle 8 at a rinse liquid processing position above the substrate W. The rinse liquid processing position may be a position at which the rinse liquid discharged from the rinse liquid supplying nozzle 8 lands on the rotation center position of the front surface of the substrate W. The controller 12 then closes the chemical liquid valve 42. The controller 12 then opens the rinse liquid valve 52 to make the rinse liquid supplying nozzle 8 supply the rinse liquid or other processing liquid toward the front surface of the substrate W in the rotating state (processing liquid supplying step). The supplied rinse liquid spreads across the entire front surface of the substrate W due to the centrifugal force and replaces the chemical liquid.

In the rinse processing step, the controller 12 controls the substrate rotation driving mechanism 23 to rotate the spin base 21 at a predetermined rinse liquid rotational speed. The rinse liquid rotational speed is, for example, 800 rpm to 1200 rpm.

Then by the supplying of the rinse liquid to the front surface of the substrate W being continued, a liquid film of the rinse liquid is formed on the front surface of the substrate W. The controller 12 controls the substrate rotation driving mechanism 23 to rotate the spin base 21 at a predetermined rinse liquid film forming speed. The rinse liquid film forming speed is, for example, 10 rpm.

An organic solvent processing step of processing the substrate W by an organic solvent, which is a low surface tension liquid of which lower surface tension is lower than the rinse liquid, is then executed (step S3). Then after the processing by the organic solvent ends, the controller 12 controls the substrate rotation driving mechanism 23. The substrate W is thereby made to undergo high speed rotation at a predetermined drying rotational speed. The drying rotational speed is, for example, 1000 rpm. The drying rotational speed is not restricted to 1000 rpm and is changeable in a range of 1000 rpm to 2500 rpm. A drying processing step (step S4) for spinning off the liquid component on the substrate W by the centrifugal force is thereby performed. In the drying processing step, the controller 12 controls the nozzle moving mechanism 60 to dispose the moving nozzle 10 at the central position. The second inert gas valve 69 is then put in an open state to make the inert gas be discharged toward the outer periphery of the substrate W. The inert gas flow F that covers the front surface of the substrate W and flows along the front surface of the substrate W is thereby formed. In the drying processing step, the controller 12 may control the nozzle moving mechanism 60 to dispose the moving nozzle 10 at the retracted position and the shielding plate 6 may be moved to the lower position instead. The drying processing step is also referred to as the spin drying step. By executing the drying processing step, the substrate processing by the substrate processing apparatus 1 ends.

Next, the organic solvent processing step performed by the processing unit 2 shall be described in detail.

Figure 4:
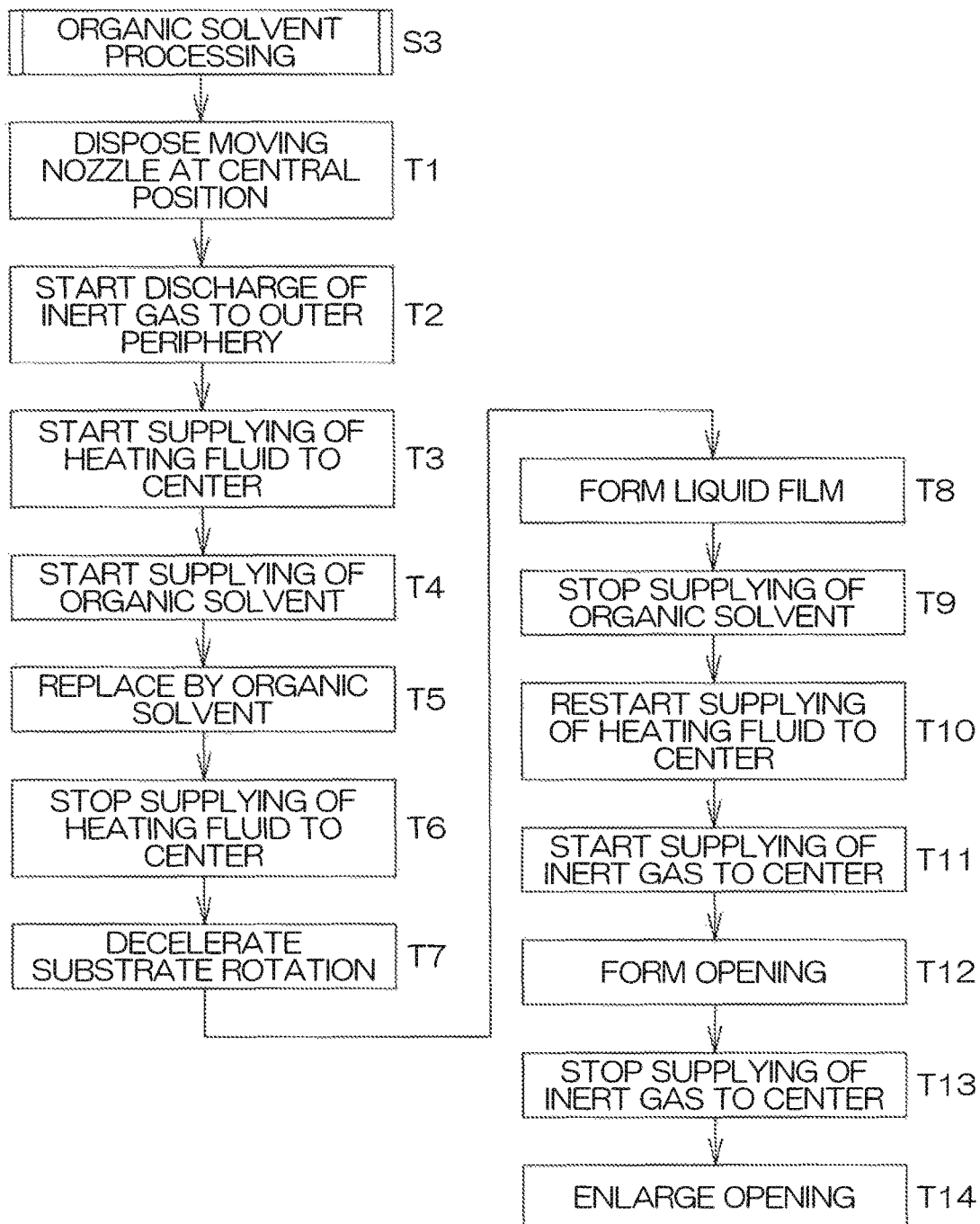
FIG. 4 is a flow diagram for describing an example of organic solvent processing performed by the processing unit.

FIG. 4 is a flow diagram for describing an example of the organic solvent processing performed by the processing unit 2. FIG. 5A to FIG. 5D are schematic sectional views for describing conditions of the example of organic solvent processing.

In the organic solvent processing step, first, the controller 12 controls the nozzle moving mechanism 60. The moving nozzle 10 is thereby disposed at the central position of facing the rotation center position of the front surface of the substrate W (step T1).

Discharge of the inert gas toward the outer periphery of the substrate W is then started to form the inert gas flow F that flows radially and parallel to the front surface of the substrate W from the center to the outer periphery of the substrate W (step T2). Specifically, the controller 12 opens the second inert gas valve 69 to make the inert gas be discharged from the moving nozzle 10 toward the outer periphery of the substrate W in the state of being held by the spin chuck 5. The inert gas flow F is thereby formed and the front surface of the substrate W becomes covered by the inert gas flow F. Forming of particles on the front surface of the substrate W held by the spin chuck 5 is thus suppressed or prevented.

Figure 5A:
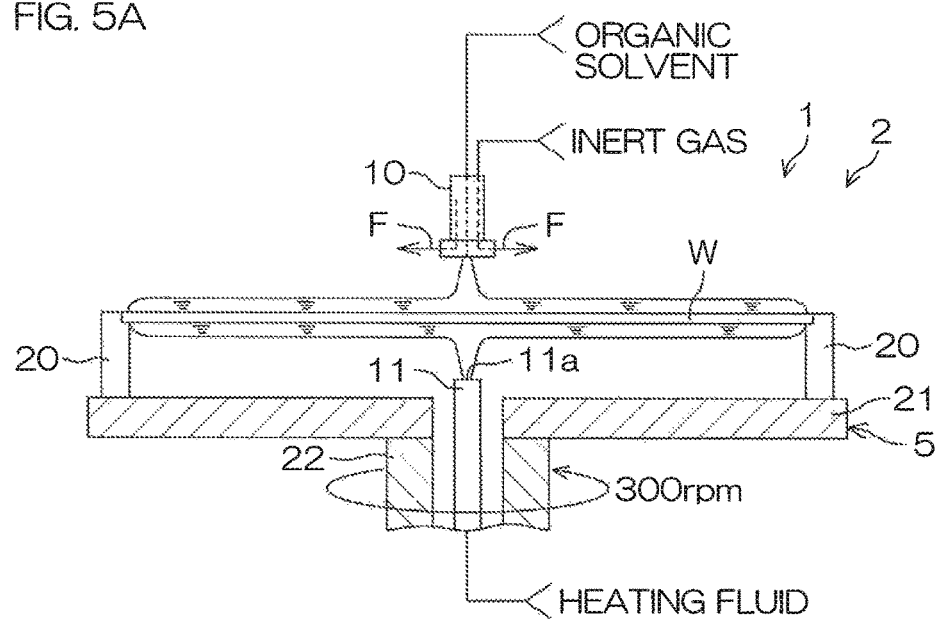
FIGS. 5A-5D are schematic sectional views for describing conditions of the organic solvent processing.

Then as shown in FIG. 5A, a replacing step of replacing the rinse liquid by the organic solvent is executed. In detail, the controller 12 opens the heating fluid valve 81 to start the supplying of the heating fluid (for example, hot water) from the heating fluid supplying nozzle 11 (step T3). The heating fluid is discharged from the discharge port 11a toward the rear surface center of the substrate W in the rotating state.

The controller 12 then closes the rinse liquid valve 52 to stop the supplying of the rinse liquid from the rinse liquid supplying nozzle 8. The controller 12 then makes the rinse liquid supplying nozzle 8 move to the retracted position. The controller 12 then opens the organic solvent valve 62 to start the supplying of the organic solvent from the moving nozzle 10 (step T4). The organic solvent supplied from the moving nozzle 10 is discharged toward the central region, including the rotation center position of the front surface, of the substrate W. The temperature (organic solvent temperature) of the organic solvent supplied from the moving nozzle 10 is, for example, 50° C.

The controller 12 then makes the organic solvent be supplied from the moving nozzle 10 toward the rotation center position of the substrate W while making the heating fluid be supplied from the heating fluid supplying nozzle 11 so that the substrate W is heated. The rinse liquid is thereby replaced by the organic solvent (step T5). In the replacing step, the controller 12 controls the substrate rotation driving mechanism 23 so that the spin base 21 rotates at a predetermined replacing speed. The replacing speed is, for example, 300 rpm.

Figure 5B:
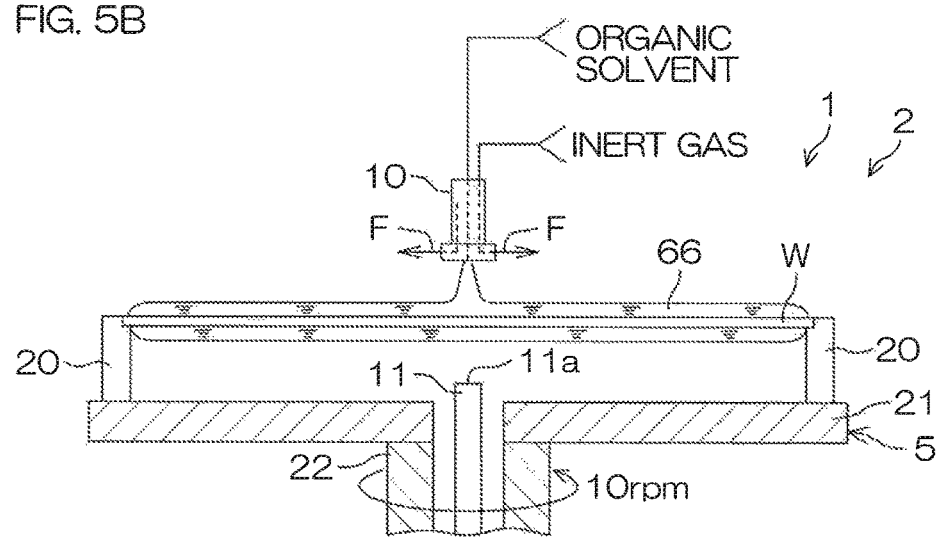

Then as shown in FIG. 5B, a liquid film forming step of forming (performing liquid accumulation of) a liquid film 66 of the organic solvent on the front surface of the substrate W is executed. In detail, the controller 12 closes the heating fluid valve 81 while sustaining the supplying of the organic solvent from the moving nozzle 10 to the rotation center of the front surface of the substrate W. The supplying of the heating fluid from the heating fluid supplying nozzle 11 to the rear surface center of the substrate W is thereby stopped (step T6). Heating of the substrate W is thereby weakened.

The controller 21 then controls the substrate rotation driving mechanism 23 to decelerate the rotation of the spin base 12 and the rotation of the substrate W is thereby decelerated in comparison to the replacing step (step T7). Specifically, the substrate rotation driving mechanism 23 is controlled so that the substrate W rotates at a predetermined liquid film forming speed (low rotation liquid accumulating step). The liquid film forming speed is, for example, 10 rpm. The liquid film forming speed may be maintained fixed within a speed range in which the liquid film 66 does not split on the substrate W. Also, the liquid film forming speed may be changed within the speed range in which the liquid film 66 does not split on the substrate W.

The controller 12 then stops the supplying of the heating fluid from the heating fluid supplying nozzle 11 to the substrate W so that the heating of the substrate W is weakened and sustains the supplying of the organic solvent from the moving nozzle 10 to the front surface of the substrate W. The liquid film 66 of the organic solvent is thereby formed on the front surface of the substrate W (step T8). The liquid film 66 formed in the liquid film forming step has a predetermined thickness. The thickness is, for example, approximately 1 mm.

Figure 5C:
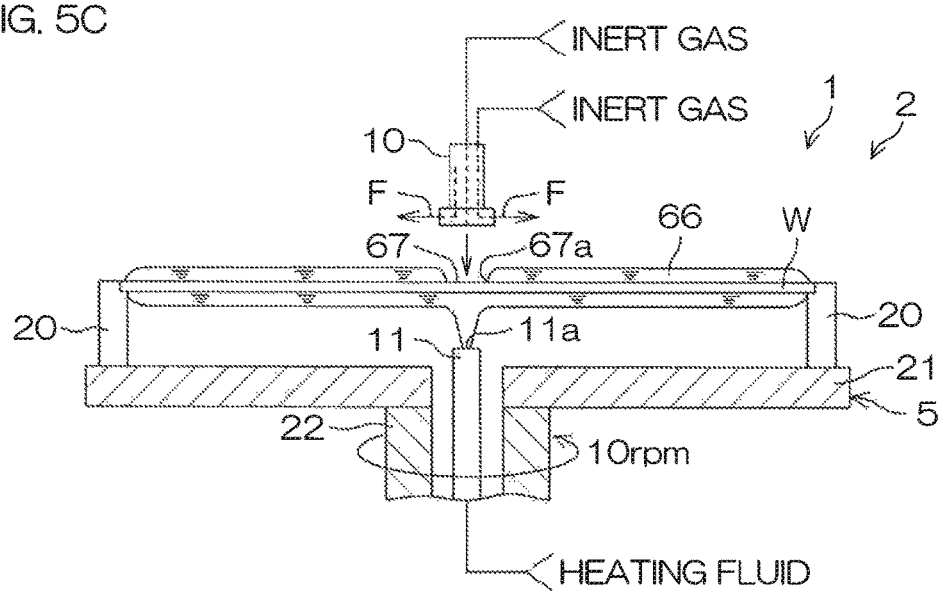
Figure 5D:
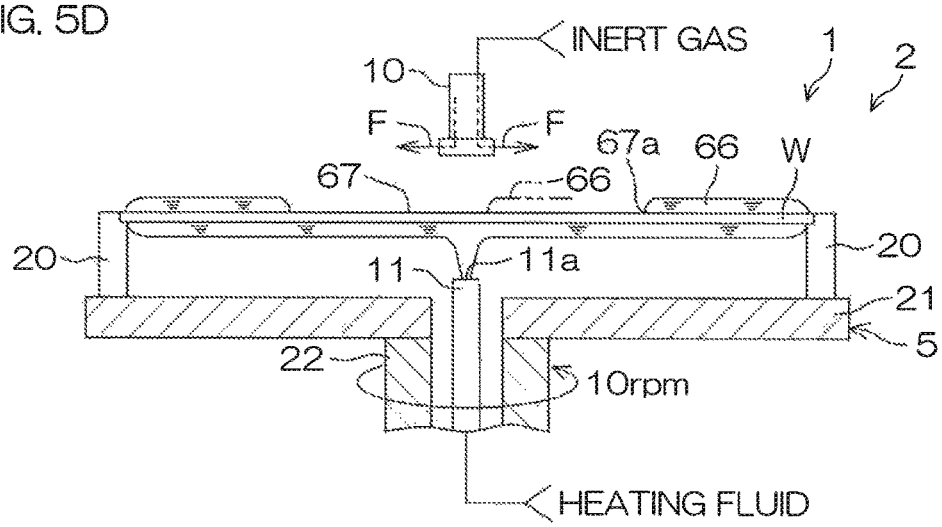

Then as shown in FIG. 5C and FIG. 5D, a liquid film removing step of removing the liquid film 66 from the front surface of the substrate W by strengthening the heating of the substrate W without supplying the organic solvent to the central region of the substrate W is executed.

In detail, the controller 12 closes the organic solvent valve 62 to stop the supplying of the organic solvent from the moving nozzle 10 to the substrate W (step T9). The controller 12 opens the heating fluid valve 81 to restart the supplying of the heating fluid from the heating fluid supplying nozzle 11 as shown in FIG. 5C (step T10). The temperature of the heating fluid is, for example, 80° C. to 85° C. This temperature is higher than the temperature (for example, of 50° C.) of the organic solvent that was supplied from the moving nozzle 10. The heating of the substrate W is strengthened by the supplying of the heating fluid. Due to the strengthening of the heating, the temperature of the central region of the substrate W reaches 77° C. to 82° C. Heat exchange between the substrate W and the heating fluid starts from immediately after the heating fluid reaches the rear surface center of the substrate W, and therefore a heat amount of the heating fluid is taken by the substrate W by the time the heating fluid reaches the outer periphery of the substrate W. The temperature of the outer periphery of the substrate W thus becomes approximately 71° C.

The controller 12 then opens the first inert gas valve 64 to start the supplying of the inert gas to the center of the substrate W (step T11).

By the central region of the substrate W being heated, an opening forming step of forming an opening 67 in a central region of the liquid film 66 is executed (step T12). In detail, the center of the rear surface of the substrate W is warmed by the heating fluid supplied from the heating fluid supplying nozzle 11. The surface tension of the organic solvent at a vicinity of the center of the substrate W is thereby decreased and the liquid film 66 thus becomes thin just at the central region of the substrate W. The temperature of the organic solvent at the central region of the substrate W rises and therefore evaporation of the organic solvent is promoted. The opening 67 is thereby formed in the central region of the liquid film 66. The forming of the opening 67 is aided by the supplying of the inert gas to the center of the substrate W.

The controller 12 then controls the substrate rotation driving mechanism 23 to decelerate the rotation of the spin base 21 so that the substrate W rotates at a lower speed than the rotational speed in the replacing step (low rotation drying step). Specifically, the substrate rotation driving mechanism 23 is controlled so that the substrate W rotates at a predetermined opening forming speed. The opening forming speed is, for example, 10 rpm. The opening forming speed is not restricted to 10 rpm and suffices to be approximately 10 rpm to 20 rpm.

The controller 12 then closes the first inert gas valve 64 to stop the supplying of the inert gas from the moving nozzle 10 to the center of the front surface of the substrate W (step T13). Then as shown in FIG. 5D, an opening enlarging step of sustaining the heating of the central region of the substrate W to spread the opening 67 toward the peripheral edge of the substrate W is executed (step T14).

The controller 12 then controls the substrate rotation driving mechanism 23 to decelerate the rotation of the spin base 21 so that the substrate W rotates at a lower speed than the rotational speed in the replacing step (low rotation drying step). Specifically, the substrate rotation driving mechanism 23 is controlled so that the substrate W rotates at a predetermined opening enlarging speed. The opening enlarging speed is, for example, 10 rpm. The opening enlarging speed is not restricted to 10 rpm and suffices to be approximately 10 rpm to 20 rpm. By the opening 67 being enlarged and the liquid film 66 being removed from the front surface of the substrate W, the processing of the substrate W by the organic solvent is ended.

The opening forming speed and the opening enlarging speed are maintained fixed within a speed range in which the liquid film 66 does not split on the substrate W. Also, the opening forming speed and the opening enlarging speed may be changed within a speed range in which the liquid film 66 does not split on the substrate W.

FIG. 6A is a schematic diagram of a vicinity of a peripheral edge 67*a* of the opening 67 in the opening enlarging step. FIG. 6B is a schematic view of a vicinity of a liquid droplet A of the organic solvent dropped onto the front surface of the substrate W in a non-rotating state.

As shown in FIG. 6A, in the opening enlarging step, by the heating of the substrate W, a convection C in a direction away from the front surface of the substrate W is generated inside the liquid film 66 at a gas-liquid interface 66a of the liquid film 66 positioned at the peripheral edge 67a of the opening 67. The convection C is generated because the closer a portion inside the liquid film 66 is to the front surface of the substrate W, the higher the liquid temperature. The convection C is generated along the direction away from the front surface of the substrate W and forms a flow along the gas-liquid interface 66a and therefore gives rise to a spontaneous movement of the liquid film 66 in a direction of enlarging the opening 67. In the opening enlarging step, the gas-liquid interface 66a of the liquid film 66 positioned at the peripheral edge 67a of the opening 67 is in contact with the front surface of the substrate W at angle $\theta 1$ that is greater than a contact angle $\theta 2$ of the organic solvent with respect to the front surface of the substrate W (see FIG. 6B). Such a state is entered when the spontaneous movement of the liquid film 66 due to the convection C is occurring. The contact angle $\theta 2$ is an angle formed in an interior of the liquid film 66 between the gas-liquid interface of the liquid droplet A of the organic solvent and the front surface of the substrate W. The angle $\theta 1$ is an angle formed in an interior of the liquid film 66 between a tangent 66b and the front surface of the substrate W. The tangent 66ab is the tangent which is drawn with an intersection of a curve, which the gas-liquid interface 66a forms on a plane orthogonal to the gas-liquid interface 66a, and the front surface of the substrate W as a tangent point. Further outside than the peripheral edge 67a of the opening 67 refers to a side that is opposite the rotation center position with respect to the peripheral edge 67a. The angle $\theta 1$ is preferably not less than 45 degrees.

The substrate W may be rotated so that a centrifugal force acts on the liquid film 66 or an inert gas may be supplied inside the opening 67 so that a blowing force due to the inert gas acts on the peripheral edge 67a of the opening 67 of the liquid film 66. Even in such cases, it is preferable for the gas-liquid interface 66a of the liquid film 66 at the peripheral edge 67a of the opening 67 to be in contact with the front surface of the substrate W at the angle $\theta 1$ (for example, an angle not less than 45 degrees) that is greater than the contact angle $\theta 2$ of the organic solvent with respect to the substrate W. If so, it may be said that a dominant mechanism for the movement of the liquid film 66 (enlargement of the opening 67) is the spontaneous movement due to the convection C inside the liquid film 66.

The liquid film 66 has a thickness of approximately 1 mm and is sufficiently thick. A temperature difference between the front surface of the substrate W and an upper surface of the liquid film 66 thus tends to be large and the convention C thereby occurs readily inside the liquid film 66. The convention C occurs even more readily if inside the liquid film 66, a difference between the temperature of the organic solvent at a vicinity of the front surface of the substrate W and the temperature of the organic solvent at a vicinity of the front surface of the liquid film 66 is 30° C. to 35° C.

Preferably in the opening forming step T12 and the opening enlarging step T14 (liquid film removing step), the controller 12 controls the heating fluid valve 81 and the substrate rotation driving mechanism 23 to control the heating and the rotation of the substrate W so that a movement speed V2 of the liquid film 66 due to the convection C inside the liquid film 66 is higher than a movement speed V1 of the liquid film 66 due to the centrifugal force acting on the liquid film 66. The movement speeds of the liquid film 66 are speeds at which the peripheral edge 67a of the opening 67 moves in the direction away from the rotation center position of the substrate W.

With the first preferred embodiment, due to the substrate W being heated, the rinse liquid on the substrate W is replaced efficiently by the organic solvent. On the other hand, when the liquid film 66 is formed, the heating of the substrate W is weakened so that the evaporation of the organic solvent is suppressed. The liquid film 66 of sufficient thickness is thus formed efficiently. Splitting of the liquid film 66 due to localized evaporation of the organic solvent can thereby be suppressed. By then strengthening the heating of the substrate W again without supplying the organic solvent to the central region of the substrate W, the liquid film 66 can be removed from the front surface of the substrate W in a mass state without splitting. The organic solvent on the front surface of the substrate W can thus be removed satisfactorily without leaving a liquid droplet of the organic solvent on the front surface of the substrate W. Surface tension due to the organic solvent, etc., that acts on the fine pattern (see FIG. 22) on the substrate W can thereby be reduced and pattern collapse can thus be suppressed or prevented.

With the first preferred embodiment, by control of the heating of the substrate W, the convection C that moves the liquid film 66, formed on the front surface of the substrate W, is generated inside the liquid film 66, and therefore the spontaneous movement of the liquid film 66 is generated by the convection C and the liquid film 66 is thereby removed from the front surface of the substrate W. Consequently, the liquid film 66 can be removed from the front surface of the substrate W in the mass state without splitting. The organic solvent on the front surface of the substrate W can thus be removed satisfactorily without leaving a liquid droplet of the organic solvent on the front surface of the substrate W.

With the first preferred embodiment, the convection C in the direction away from the substrate W is generated at the gas-liquid interface 66a of the liquid film 66 at the peripheral edge 67a of the opening 67 formed in the central region of the liquid film 66 of the organic solvent. The convection C gives rise to the spontaneous movement in the direction of spreading the opening 67. The opening 67 is thereby enlarged. The organic solvent can thus be removed even more satisfactorily from the front surface of the substrate W without splitting the liquid film 66.

With the first preferred embodiment, the opening 67 is enlarged without supplying the inert gas to the substrate W in the opening enlarging step. Cooling of the convection C at the gas-liquid interface 66a of the liquid film 66 by the inert gas is thus prevented. Further, disturbance of the convection C by the inert gas is also prevented. Further, destruction of the liquid film 66 by the inert gas is also prevented.

With the first preferred embodiment, in the replacing step, the organic solvent is supplied to the front surface of the substrate W while the processing liquid is being removed by the centrifugal force generated by the rotation of the substrate W, and therefore the processing liquid on the substrate W can be replaced by the organic solvent with good efficiency. In the liquid film forming step, the centrifugal force can be reduced by decelerating the rotation of the substrate W. An amount of the organic solvent removed from the substrate W is thereby reduced and therefore the liquid film 66 can be formed satisfactorily. In the liquid film removing step, the substrate W is rotated at a lower speed than the rotational speed in the replacing step so that the state in which the spontaneous movement of the liquid film 66 due to heating is dominant is entered and the spontaneous movement of the liquid film 66 can be aided by an appropriate centrifugal force.

With the first preferred embodiment, the spontaneous movement speed V2 of the liquid film 66 due to the convection C is higher than the movement speed V1 of the liquid film 66 due to the centrifugal force acting on the liquid film 66, and therefore the amount of the organic solvent removed from the substrate W by the centrifugal force can be suppressed. Splitting of the liquid film 66 on the substrate W can thereby be suppressed further. The organic solvent on the front surface of the substrate W can thus be removed even more satisfactorily.

With the first preferred embodiment, the substrate W rotates within the speed range in which the liquid film 66 does not split on the substrate W and therefore the movement of the liquid film 66 is aided by the centrifugal force and the liquid film 66 is removed off the substrate W while being kept in the liquid mass state.

With the first preferred embodiment, the moving nozzle 10 supplies the organic solvent that is lower in temperature than the substrate W and therefore the convection C inside the liquid film 66 is generated more readily by the temperature difference with respect to the substrate W. The temperature of the organic solvent is preferably lower than the temperature of the substrate W at a vicinity of the position of heating by the supplying of the heating fluid by the heating fluid supplying nozzle 11. The convection C directed from the substrate W to the front surface of the liquid film 66 can thereby be generated and promoted at the vicinity of the heating position, and therefore the liquid film 66 can be removed efficiently off the substrate W by the spontaneous movement of the liquid film 66 on the substrate W.

With the first preferred embodiment, by supplying the heating fluid toward the rear surface center of the substrate W, the evaporation of the organic solvent of the liquid film 66 at the vicinity of the center (at the central region) of the substrate W is promoted and an onset point of the convection C inside the liquid film 66 is disposed at the central region of the substrate W. The opening 67 can thereby be formed in the liquid film 66 at the center of the substrate W, that is, at a center position of the liquid film 66. By then making the liquid film 66 move so as to spread the opening 67 to the outside, the liquid film 66 can be removed off the substrate W. The outside of the substrate W refers to a side away from the center of the substrate W.

When the shielding plate 6 is provided as in the first preferred embodiment, moisture contained in the atmosphere in the periphery of the atmosphere between the substrate W and the shielding plate 6 can be suppressed from dissolving into the liquid film 66.

Preferably in the first preferred embodiment, the stoppage of the supplying of the heating fluid from the heating fluid supplying nozzle 11 (step T6) is performed before the stoppage of the supplying of the organic solvent from the moving nozzle 10 (step T9) in order to suppress the heating fluid from flowing around from the rear surface to the front surface of the substrate W.

With the first preferred embodiment, the front surface of the substrate W can be protected by the moving nozzle 10 supplying the inert gas not just toward the center of substrate W but also toward the outer periphery of the substrate W in the drying processing step.

Second Preferred Embodiment

Figure 7:
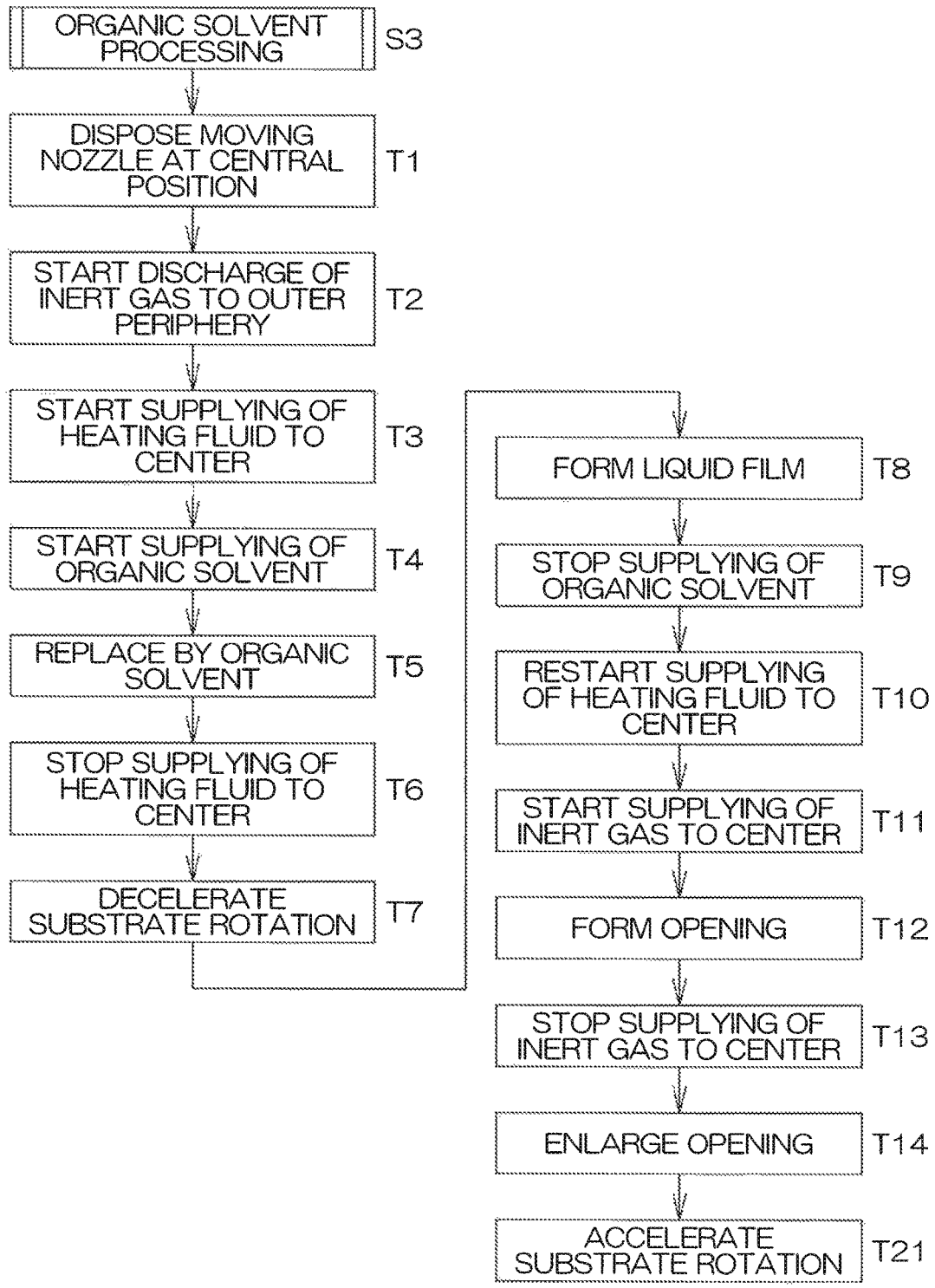
FIG. 7 is a flow diagram for describing an example of organic solvent processing performed by a processing unit included in a substrate processing apparatus according to a second preferred embodiment of the present invention.
Figure 8:
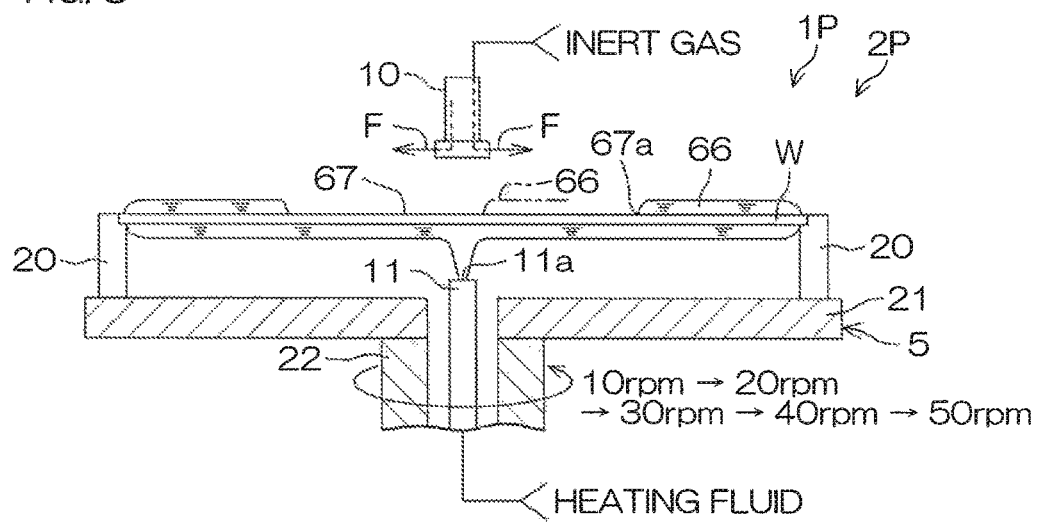
FIG. 8 is a schematic sectional view for describing conditions of an opening enlarging step in the organic solvent processing performed by the processing unit according to the second preferred embodiment of the present invention.

A substrate processing apparatus 1P according to the second preferred embodiment has the same arrangement as the substrate processing apparatus 1 according to the first preferred embodiment. FIG. 7 is a flow diagram for describing an example of organic solvent processing performed by a processing unit 2P included in the substrate processing apparatus 1P according to the second preferred embodiment of the present invention. FIG. 8 is a schematic sectional view for describing conditions of the opening enlarging step in the organic solvent processing performed by the processing unit 2P. In FIG. 7 and FIG. 8 and FIG. 9 to FIG. 21B to be described below, members that are the same as the members that have been described thus far shall be provided with the same reference numbers and description thereof shall be omitted.

A main point of difference of the organic solvent processing performed by the processing unit 2P according to the second preferred embodiment with respect to the organic solvent processing performed by the processing unit 2 according to the first preferred embodiment (see FIG. 4) is that in the opening enlarging step, the controller 12 controls the substrate rotation driving mechanism 23 in accordance with the enlargement of the opening 67 so that the rotation of the substrate W is gradually accelerated (step T21). In the present example, the rotation of the substrate W is accelerated stepwise from the liquid film forming speed. More specifically, the rotational speed of the substrate W is increased from 10 rpm to 20 rpm, maintained thereat for a predetermined time (for example, 10 seconds), thereafter increased to and maintained at 30 rpm for a predetermined time (for example, 10 seconds), thereafter increased to and maintained at 40 rpm for a predetermined time (for example, 10 seconds), and thereafter increased to and maintained at 50 rpm for a predetermined time (for example, 10 seconds).

With the second preferred embodiment, the similar effects as those of the first preferred embodiment are exhibited.

In comparison to the center of the substrate W, heat of the heating fluid supplied from the heating fluid supplying nozzle 11 is less readily transferred to the substrate W at a vicinity of the outer periphery of the substrate W. Therefore, in the opening enlarging step, the spontaneous movement speed of the liquid film 66 is slower when the peripheral edge 67a of the opening 67 is at the vicinity of the outer periphery of the substrate W in comparison to when the peripheral edge 67a of the opening 67 is at the center of the substrate W. Therefore, by gradually accelerating the rotational speed of the substrate W and increasing the centrifugal force as the peripheral edge 67a of the opening 67 approaches the outer periphery of the substrate W in the opening enlarging step, a degree of aiding of the movement of the liquid film 66 can be made large when the peripheral edge 67a of the opening 67 is at the vicinity of the outer periphery of the substrate W.

Third Preferred Embodiment

Figure 9:
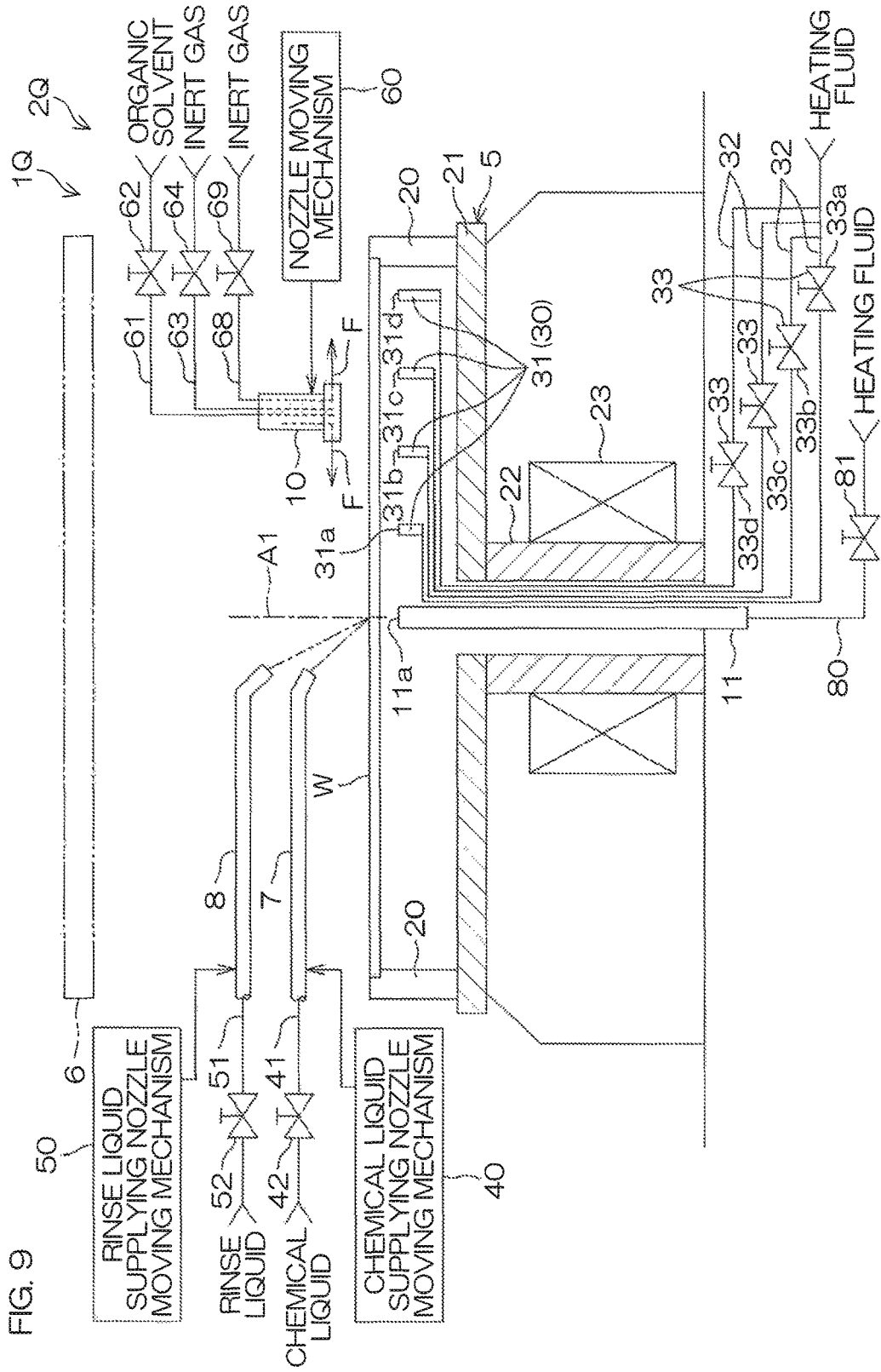
FIG. 9 is a schematic sectional view for describing an arrangement example of a processing unit included in a substrate processing apparatus according to a third preferred embodiment of the present invention.

FIG. 9 is a schematic sectional view for describing an arrangement example of a processing unit 2Q included in a substrate processing apparatus 1Q according to a third preferred embodiment of the present invention.

A main point of difference of the processing unit 2Q according to the third preferred embodiment with respect to the processing unit 2 according to the first preferred embodiment (see FIG. 1) is that the processing unit 2Q includes an outer peripheral portion heating mechanism 30 that heats the substrate W at outer peripheral positions away from the center of the substrate W. The outer peripheral positions are positions of the substrate W that are further outside than the position (central region) that can be heated in particular by the heating fluid being supplied by the heating fluid supplying nozzle 11 to the center of the rear surface of the substrate W. The outer peripheral portion heating mechanism 30 is included in an outer peripheral portion heating unit that heats the substrate W at the outer peripheral positions.

The outer peripheral portion heating mechanism 30 of the third preferred embodiment includes a plurality of outer peripheral position heating fluid supplying nozzles 31 that are respectively disposed at a plurality of positions differing in distance from the center of the substrate and supply the heating fluid toward positions away from the center of the rear surface of the substrate W. Each of the plurality of outer peripheral position heating fluid supplying nozzles 31 is capable of supplying the heating fluid to the corresponding outer peripheral position. The plurality of outer peripheral position heating fluid supplying nozzles 31 are aligned along a rotational radius direction of the substrate W. The plurality of outer peripheral position heating fluid supplying nozzles 31 are made to face an annular region of the rear surface of the substrate W by the substrate W being rotated around the rotational axis A1. The annular region is a region ranging from a predetermined position away from the central region, including the center, of the substrate W to the outer periphery of the substrate W.

A plurality of heating fluid supply pipes 32 are respectively coupled to the plurality of outer peripheral position heating fluid supplying nozzles 31, and a plurality of heating fluid valves 33 are respectively interposed in the plurality of heating fluid supply pipes 32. In other words, an individual heating fluid supply pipe 32 is coupled to each outer peripheral position heating fluid supplying nozzle 31, and a single heating fluid valve 33 is interposed in that heating fluid supply pipe 32. The plurality of heating fluid valves 33 are included in a supply switching unit that performs respective switching between supplying and not supplying the heating fluid to the corresponding outer peripheral position heating fluid supplying nozzles 31. Symbols 31a to 31d are successively attached to the outer peripheral position heating fluid supplying nozzles 31 starting from that closest to the rotation center position and symbols 33a to 33d are attached respectively to the heating fluid valves 33 corresponding to the outer peripheral position heating fluid supplying nozzles 31a to 31d.

The controller 12 can move the position of heating the substrate W by controlling the heating fluid valve 81 and the plurality of heating fluid valves 33 so as to change the nozzle that supplies the heating fluid. By supplying the heating fluid to the nozzle, among the heating fluid supplying nozzle 11 and the plurality of outer peripheral position heating fluid supplying nozzles 31, that can heat the portion of the substrate W at which the peripheral edge 67a of the opening 67 is positioned, the generation of the convection C at the gas-liquid interface 66a of the liquid film 66 at the peripheral edge 67a of the opening 67 can be promoted.

Figure 10:
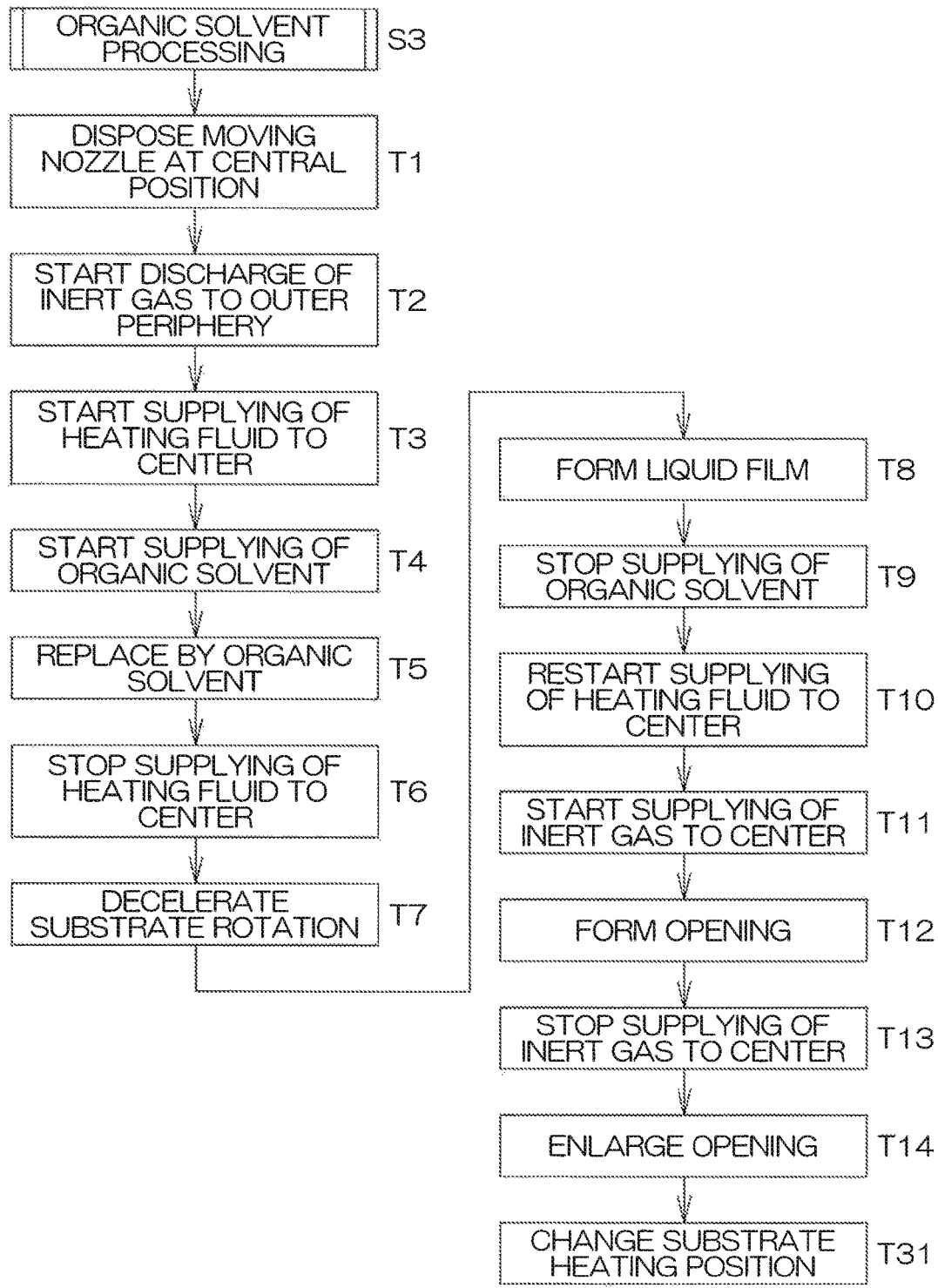
FIG. 10 is a flow diagram for describing an example of organic solvent processing performed by the processing unit according to the third preferred embodiment.
Figure 11:
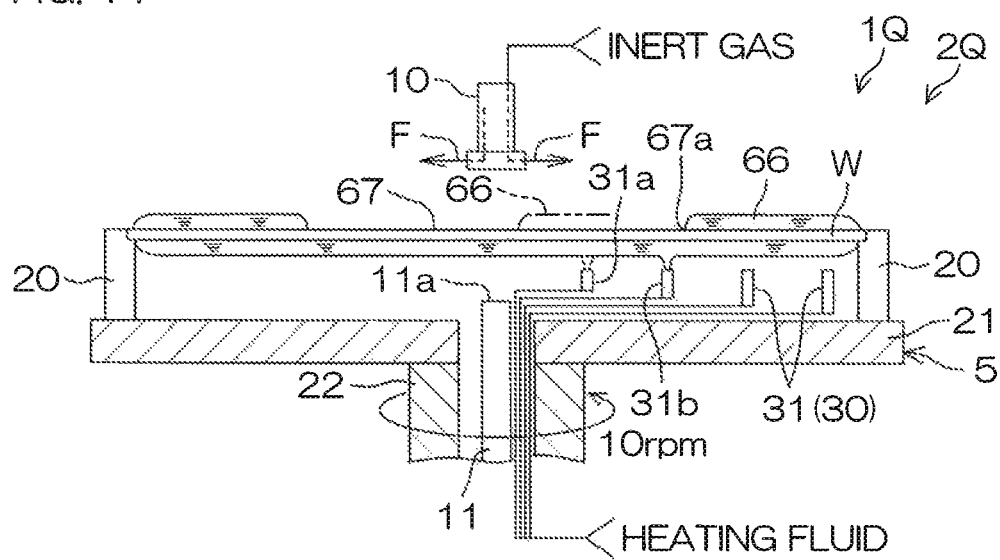
FIG. 11 is a schematic sectional view for describing conditions of the opening enlarging step in the organic solvent processing performed by the processing unit according to the third preferred embodiment.

FIG. 10 is a flow diagram for describing an example of organic solvent processing performed by the processing unit 2Q. FIG. 11 is a schematic sectional view for describing conditions of the opening enlarging step in the organic solvent processing performed by the processing unit 2Q.

A main point of difference of the organic solvent processing performed by the processing unit 2Q according to the third preferred embodiment with respect to the organic solvent processing performed by the processing unit 2 according to the first preferred embodiment (see FIG. 4) is that the position of heating the substrate W is changed in the opening enlarging step (step T31).

In detail, when, by the spontaneous movement of the liquid film 66, the peripheral edge 67a of the opening 67 moves further outside than the central region, the controller 12 closes the heating fluid valve 81. The supplying of the heating fluid to the center of the rear surface of the substrate W from the heating fluid supplying nozzle 11 is thereby stopped. The controller 12 then opens the heating fluid valve 33a corresponding to the outer peripheral position heating fluid supplying nozzle 31a that is closest to the rotation center position of the substrate W. Supplying of the heating fluid from the heating fluid valve 33a to the rear surface of the portion of the substrate W at which the peripheral edge 67a of the opening 67 is positioned is thereby started.

Then when the peripheral edge 67a of the opening 67 moves on the substrate W to further outside than the position at which the previous outer peripheral position heating fluid supplying nozzle 31a can heat the substrate W in particular, the controller 12 opens the heating fluid valve 33b corresponding to the outer peripheral position heating fluid supplying nozzles 31b. Supplying of the heating fluid by the outer peripheral position heating fluid supplying nozzle 31b, further outside than the outer peripheral position heating fluid supplying nozzle 31a, is thereby started. The controller 12 then closes the heating fluid valve 33a to stop the supplying of the heating fluid from the outer peripheral position heating fluid supplying nozzle 31a.

Then, when the peripheral edge 67a of the opening 67 moves on the substrate W to further outside than the position at which the previous outer peripheral position heating fluid supplying nozzle 31b can heat the substrate W in particular, the controller 12 controls the heating fluid valves 33c and 33d. Supplying of the heating fluid from the outer peripheral position heating fluid supplying nozzles 31c and 31d suited to the position of the peripheral edge 67a is thereby started.

The controller 12 controls the plurality of heating fluid valves 33 to sustain the supplying of the heating fluid from any of the plurality of outer peripheral position heating fluid supplying nozzles 31 until the liquid film 66 is removed.

The heating fluid valve 81 and the plurality of heating fluid valves 33 are thus included in a heating position moving unit that moves the position of heating the substrate W in accordance with the movement of the peripheral edge 67a of the opening 67.

With the third preferred embodiment, the similar effects as the first preferred embodiment are exhibited.

With the third preferred embodiment, the heating position moves in accordance with the movement of the peripheral edge 67a of the opening 67 and therefore the convection C can be generated satisfactorily at the gas-liquid interface 66a of the liquid film 66 positioned at the peripheral edge 67a of the opening 67. The organic solvent on the front surface of the substrate W can thus be removed even more satisfactorily.

With the third preferred embodiment, the evaporation of the organic solvent at each outer peripheral position can be promoted by heating the substrate W at the outer peripheral position, and the liquid film 66 can thus be removed efficiently.

With the third preferred embodiment, just the portion of the substrate W that requires heating in particular to generate the convection C can be heated in accordance with the position of the peripheral edge 67a of the opening 67 to enable reduction of usage amount of the heating fluid for generating the convection C.

Fourth Preferred Embodiment

Figure 12:
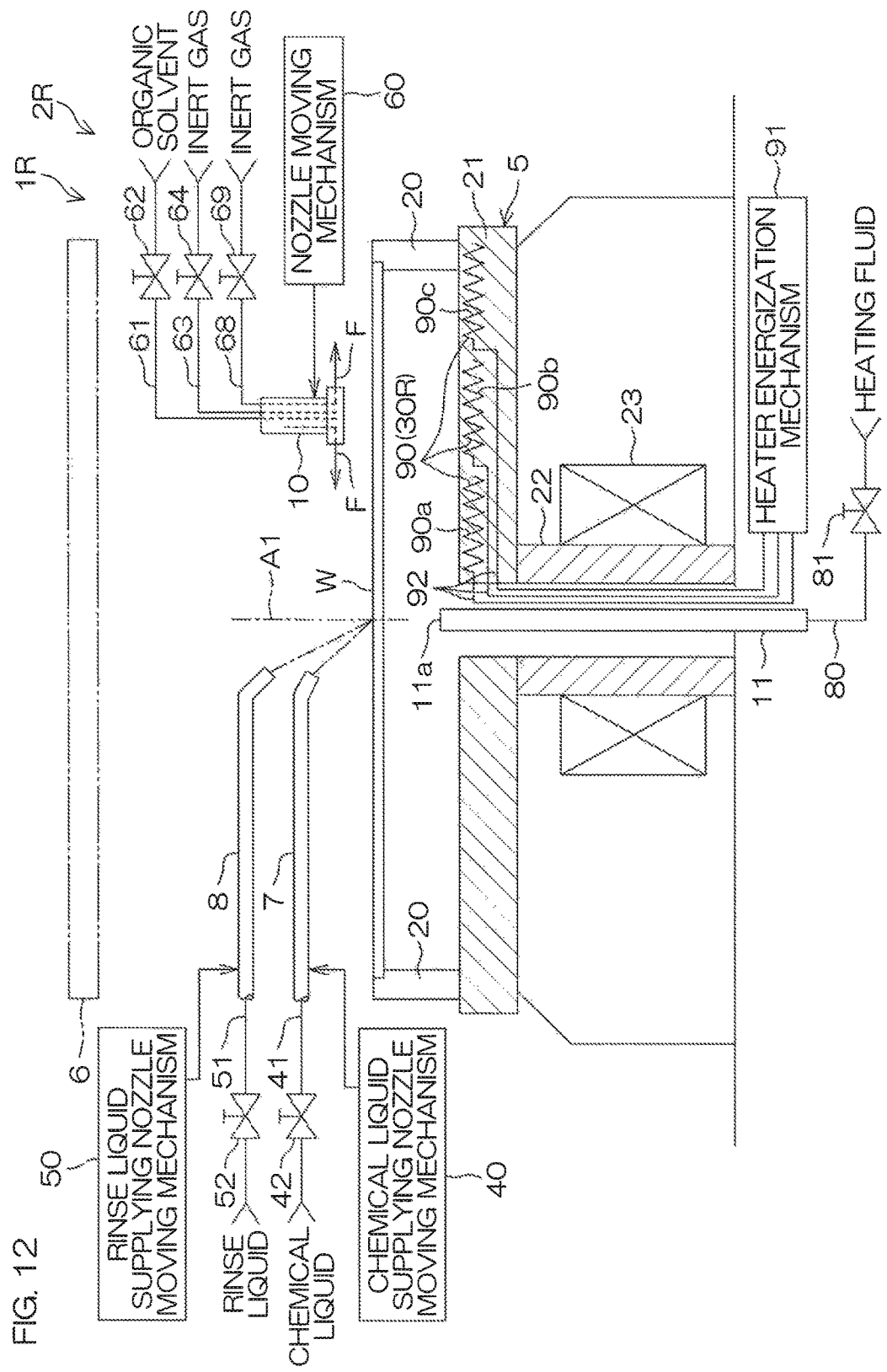
FIG. 12 is a schematic sectional view for describing an arrangement example of a processing unit included in a substrate processing apparatus according to a fourth preferred embodiment of the present invention.

FIG. 12 is a schematic sectional view for describing an arrangement example of a processing unit 2R included in a substrate processing apparatus 1R according to a fourth preferred embodiment.

A main point of difference of the processing unit 2R according to the fourth preferred embodiment with respect to the processing unit 2 according to the first preferred embodiment (see FIG. 1) is that an outer peripheral portion heating mechanism 30R that heats the substrate W at outer peripheral positions includes a plurality of heaters 90. The outer peripheral portion heating mechanism 30R is included in a substrate heating unit that heats the substrate W held by the chuck pins 20 and the spin base 21. The plurality of heaters 90 are, for example, resistor bodies that are incorporated in the spin base 21 and extend in the rotational radius direction. The plurality of heaters 90 face the outer peripheral positions from below the substrate W. The plurality of heaters 90 face an annular region of the rear surface of the substrate W due to the substrate W being rotated around the rotational axis A1.

The plurality of heaters 90 are disposed along the rotational radius direction. A heater energization mechanism 91, which energizes the respective heaters 90 to raise the temperatures of the respective heaters 90, is connected to the plurality of heaters 90. Electric power from the heater energization mechanism 91 is supplied to the plurality of heaters 90 by feeders 92 that are passed through the interior of the rotating shaft 22. Although in the present preferred embodiment, the plurality of heaters 90 are connected to the heater energization mechanism 91 in common, the plurality of heaters 90 may be connected respectively to different heater energization mechanisms. The controller 12 is capable of moving the position of heating the substrate W by controlling the heater energization mechanism 91 so that the heater 90 that is energized is changed. To promote the generation of the convection C at the gas-liquid interface 66a of the liquid film 66 at the peripheral edge 67a of the opening 67, it is preferable to heat the substrate W using the heater 90 that faces the peripheral edge 67a of the opening 67 from below.

With the outer peripheral portion heating mechanism 30R, different temperatures may be set according to each heater 90. The temperatures of the respective heaters 90 may be set so as to become higher with distance away from the rotation center position of the substrate W.

Each heater 90 may be formed to a circular annular shape that is a shape that surrounds the rotational axis A1 or may be formed to a C shape, with which a portion of a circular annulus is interrupted in a circumferential direction. When the heaters 90 are formed to circular annular shapes, the heaters 90 are included in an annular region heating unit that heats the annular region.

The controller 12 can control the energization of the respective heaters 90 by controlling the heater energization mechanism 91. The controller 12 can thereby move the position of the substrate W heated by the heaters 90.

Figure 13:
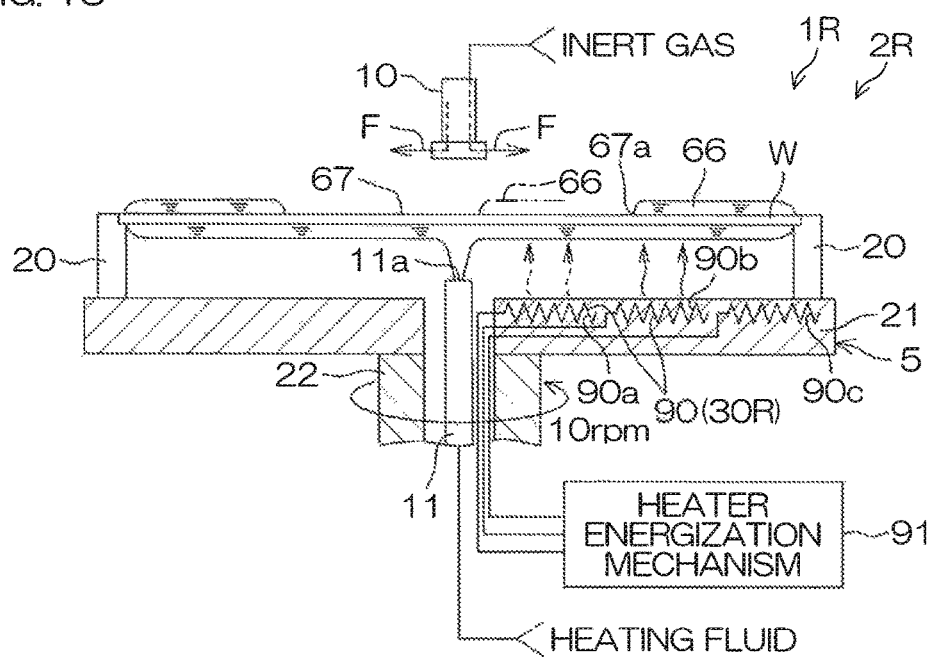
FIG. 13 is a schematic sectional view for describing conditions of the opening enlarging step in organic solvent processing performed by the processing unit according to the fourth preferred embodiment.

FIG. 13 is a schematic sectional view for describing conditions of the opening enlarging step in organic solvent processing performed by the processing unit 2R.

In the organic solvent processing performed by the processing unit 2R according to the fourth preferred embodiment, the position of heating the substrate W is changed in the opening enlarging step (step T31) as in the organic solvent processing performed by the processing unit 2Q according to the third preferred embodiment (see FIG. 10).

In detail, when, by the spontaneous movement of the liquid film 66, the peripheral edge 67a of the opening 67 moves on the substrate W to further outside than the central region, the controller 12 closes the heating fluid valve 81. The supplying of the heating fluid to the center of the rear surface of the substrate W from the heating fluid supplying nozzle 11 is thereby stopped. The controller 12 then controls the heater energization mechanism 91 so that a heater 90a closest to the rotation center position of the substrate W is energized. The heating of the portion of the substrate W at which the peripheral edge 67a of the opening 67 is positioned is thereby started.

Then when the peripheral edge 67a of the opening 67 moves further toward the outer periphery of the substrate W to a position facing a heater 90b disposed further outside than the previous heater 90a, the controller 12 controls the heater energization mechanism 91. Heating of the substrate W by the heater 90b is thereby started. The controller 12 then controls the heater energization mechanism 91 to stop the heating of the substrate W by the heater 90a.

Then, when the peripheral edge 67a of the opening 67 moves further toward the outer periphery of the substrate W to a position facing a heater 90c disposed further outside than the previous heater 90b, the controller 12 controls the heater energization mechanism 91. Heating of the substrate W by the heater 90c is thereby started. The controller 12 then controls the heater energization mechanism 91 to stop the heating of the substrate W by the heater 90b.

The controller 12 controls the heater energization mechanism 91 to sustain the heating by any of the plurality of heaters 90 until the liquid film 66 is removed.

The heater energization mechanism 91 is thus included in the heating position moving unit that moves the position of heating the substrate W.

With the fourth preferred embodiment, the similar effects as the third preferred embodiment are exhibited.

With the fourth preferred embodiment, the heaters 90 are included in the annular region heating unit. The entirety of the substrate W can thus be heated evenly (especially in the circumferential direction) by the heaters 90 heating the annular region. The convection C inside the liquid film 66 is thus maintained. The liquid film 66 can thereby be removed efficiently by the spontaneous movement of the liquid film 66 due to the heating.

Fifth Preferred Embodiment

Figure 14:
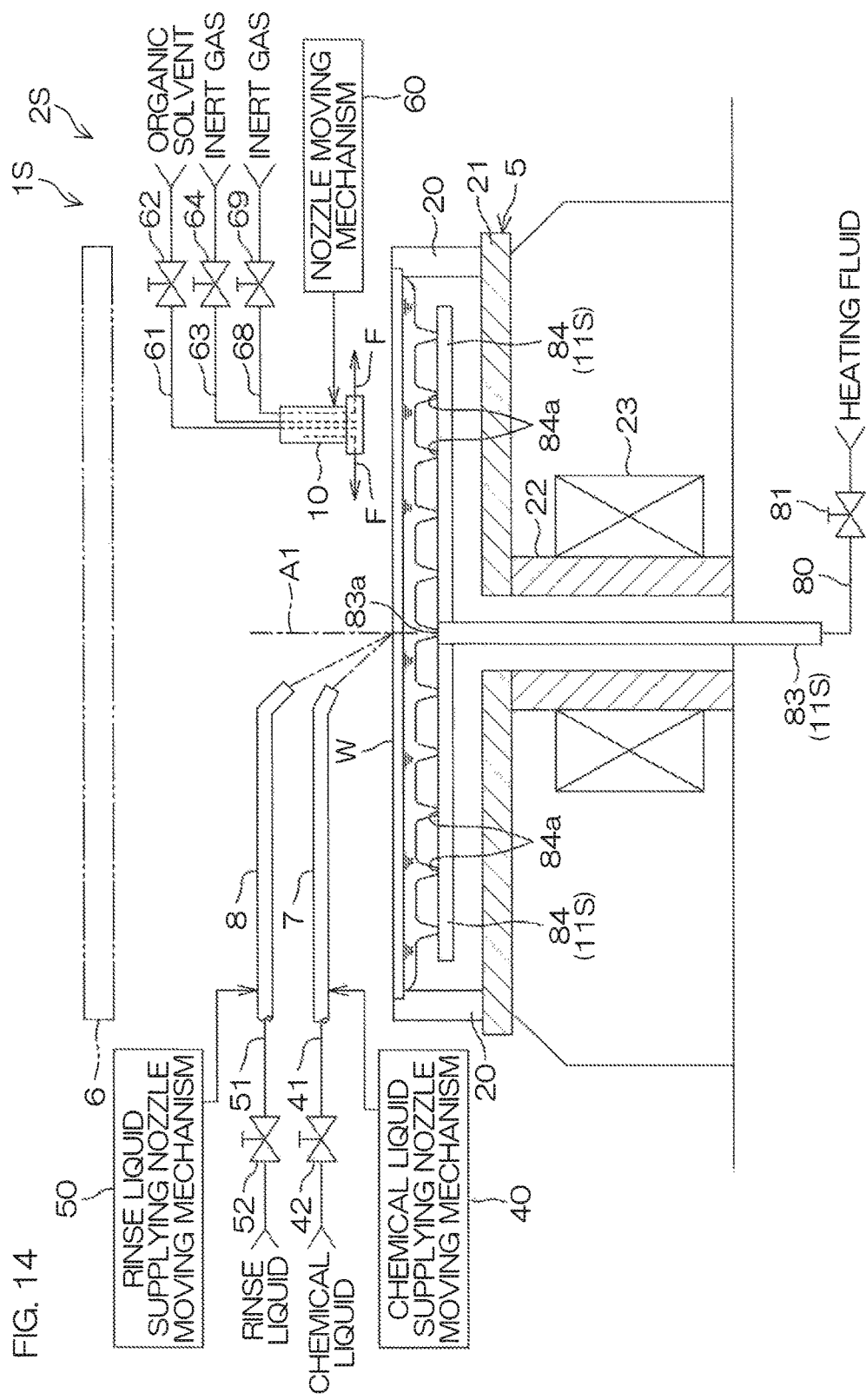
FIG. 14 is a schematic sectional view for describing an arrangement example of a processing unit included in a substrate processing apparatus according to a fifth preferred embodiment of the present invention.

FIG. 14 is a schematic sectional view for describing an arrangement example of a processing unit 2S included in a substrate processing apparatus 1S according to a fifth preferred embodiment of the present invention.

The processing unit 2S included in the substrate processing apparatus 1S according to the fifth preferred embodiment differs from the processing unit 2 included in the substrate processing apparatus 1 according to the first preferred embodiment mainly in the following point. That is, the processing unit 2S includes a heating fluid supplying nozzle 11S in place of the heating fluid supplying nozzle 11 of the first preferred embodiment (see FIG. 1). The heating fluid supplying nozzle 11S is included in the substrate heating unit. The heating fluid supplying nozzle 11S includes a center heating fluid supplying nozzle 83, which supplies the heating fluid toward the central region, including the rotation center position of the rear surface, of the substrate W, and outer peripheral position heating fluid supplying nozzles 84, which supply the heating fluid to outer peripheral positions away from the center of the substrate W.

The center heating fluid supplying nozzle 83 extends along the vertical direction. The center heating fluid supplying nozzle 83 is inserted through the rotating shaft 22. The center heating fluid supplying nozzle 83 has, at an upper end, a discharge port 83a facing the center of the rear surface of the substrate W. If the heating fluid is hot water, the center heating fluid supplying nozzle 83 is included in the center hot water supplying unit that supplies the hot water to the rear surface center of the substrate W.

The outer peripheral position heating fluid supplying nozzles 84 are included in the outer peripheral portion heating unit that heats the substrate W at the outer peripheral positions. The outer peripheral position heating fluid supplying nozzles 84 have forms of bar nozzles extending in rotational radius directions from a tip of the center heating fluid supplying nozzle 83.

A plurality of the outer peripheral position heating fluid supplying nozzles 84 may be provided. Two outer peripheral position heating fluid supplying nozzles 84 are provided in the fifth preferred embodiment. The two outer peripheral position heating fluid supplying nozzles 84 are separated from each other by 180 degrees in regard to a rotation direction of the substrate W.

Each outer peripheral position heating fluid supplying nozzle 84 has a plurality of discharge ports 84a facing the outer peripheral positions separated from the center of the rear surface of the substrate W. The plurality of discharge ports 84a are respectively disposed at a plurality of positions differing in distance from the rotational axis A1. The plurality of discharge ports 84a face an annular region of the rear surface of the substrate W due to the substrate W being rotated around the rotational axis A1.

Figure 15:
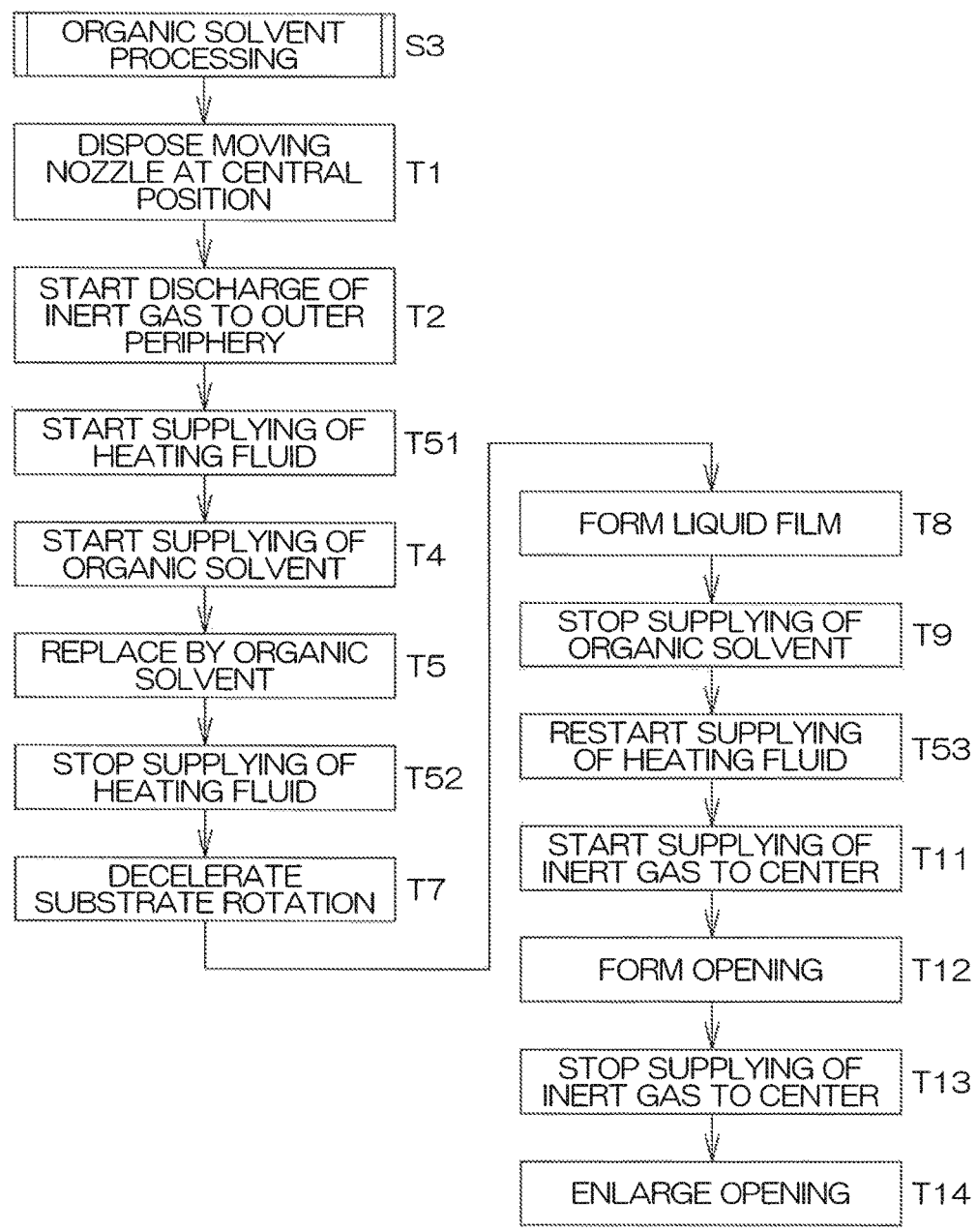
FIG. 15 is a flow diagram for describing an example of organic solvent processing performed by the processing unit according to the fifth preferred embodiment.

FIG. 15 is a flow diagram for describing details of organic solvent processing performed by the processing unit 2S according to the fifth preferred embodiment.

The organic solvent processing performed by the processing unit 2S according to the fifth preferred embodiment differs slightly from the organic solvent processing performed by the processing unit 2 according to the first preferred embodiment (see FIG. 4).

In the organic solvent processing performed by the processing unit 2S, instead of starting the supplying of the heating fluid to the center of the rear surface of the substrate W (step T3 of FIG. 4), supplying of the heating fluid toward the center of the rear surface of the substrate W and the plurality of outer peripheral positions of the rear surface of the substrate W is started by the heating fluid supplying nozzle 11S (step T51).

In the organic solvent processing by the processing unit 2S, instead of stopping the supplying of the heating fluid to the center of the rear surface of the substrate W (step T6 of FIG. 4), the supplying of the heating fluid toward the center of the rear surface of the substrate W and the plurality of outer peripheral positions of the rear surface of the substrate W is stopped by the heating fluid supplying nozzle 11S (step T52).

In the organic solvent processing by the processing unit 2S, instead of restarting the supplying of the heating fluid to the center of the rear surface of the substrate W (step T10 of FIG. 4), the supplying of the heating fluid toward the center of the rear surface of the substrate W and the plurality of outer peripheral positions of the rear surface of the substrate W is restarted by the heating fluid supplying nozzle 11S (step T53).

Although the annular region of the substrate W is also heated by the outer peripheral position heating fluid supplying nozzles 84, it is not constantly and continuously heated by the heating fluid as in the central region of the substrate W because the substrate W is rotating. The annular region of the substrate W is thus lower in temperature than the central region of the substrate W. For example, the temperature of the central region of the substrate W is 77° C. to 82° C. and the temperature of the outer periphery of the substrate W is approximately 75° C. The forming of the opening 67 in the annular region of the substrate W is thus suppressed.

With the fifth preferred embodiment, the similar effects as those of the first preferred embodiment are exhibited.

With the fifth preferred embodiment, the substrate W is heated at the outer peripheral positions to which the heating fluid is supplied from the heating fluid supplying nozzle 11S. The evaporation of the organic solvent at the outer peripheral positions can thus be accelerated and the liquid film 66 can thus be removed efficiently.

Sixth Preferred Embodiment

A substrate processing apparatus 1T according to the sixth preferred embodiment has the same arrangement as the substrate processing apparatus 1S according to the fifth preferred embodiment (see FIG. 14).

Figure 16:
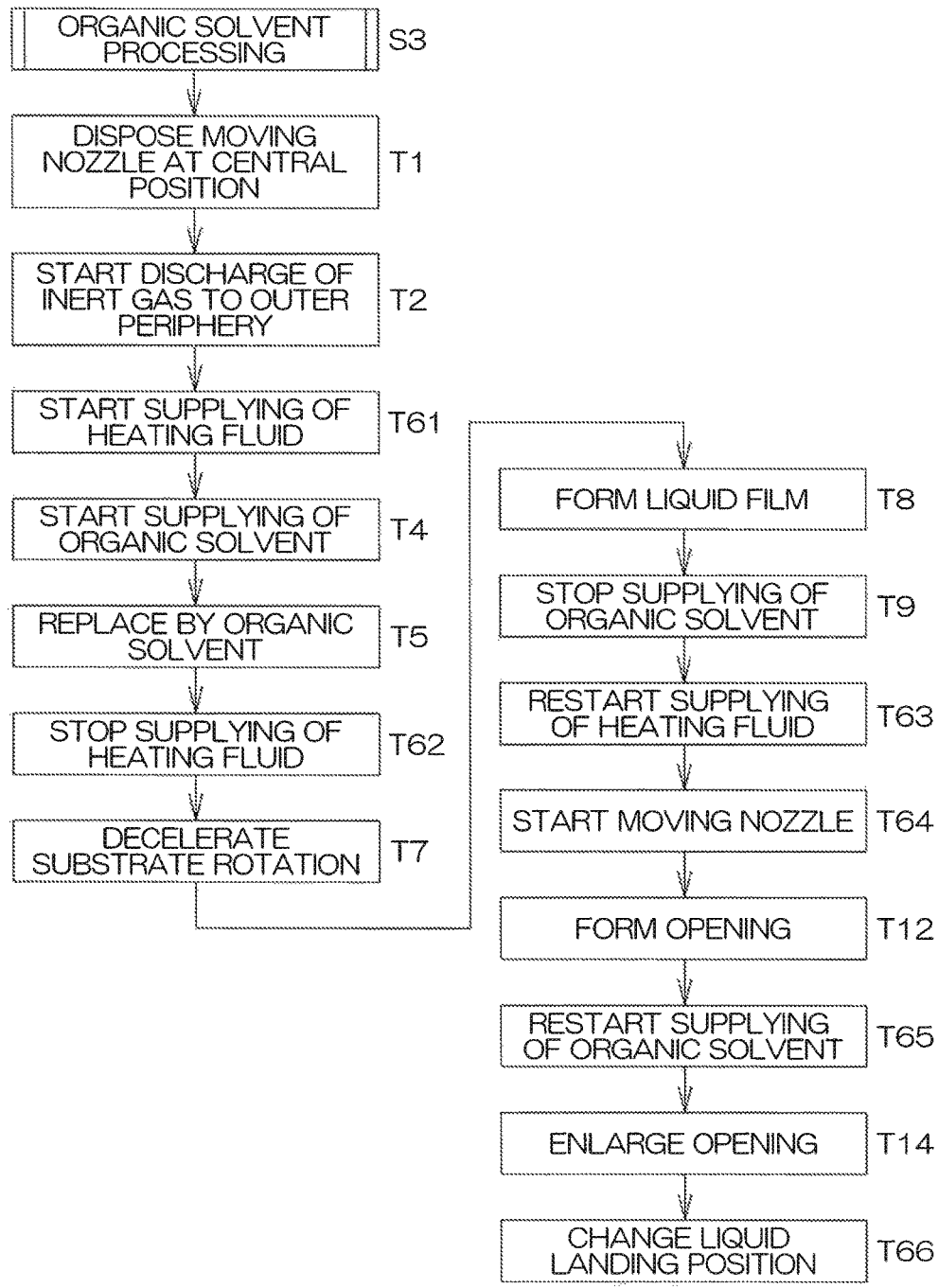
FIG. 16 is a flow diagram for describing an example of organic solvent processing performed by a processing unit according to a sixth preferred embodiment of the present invention.
Figure 17:
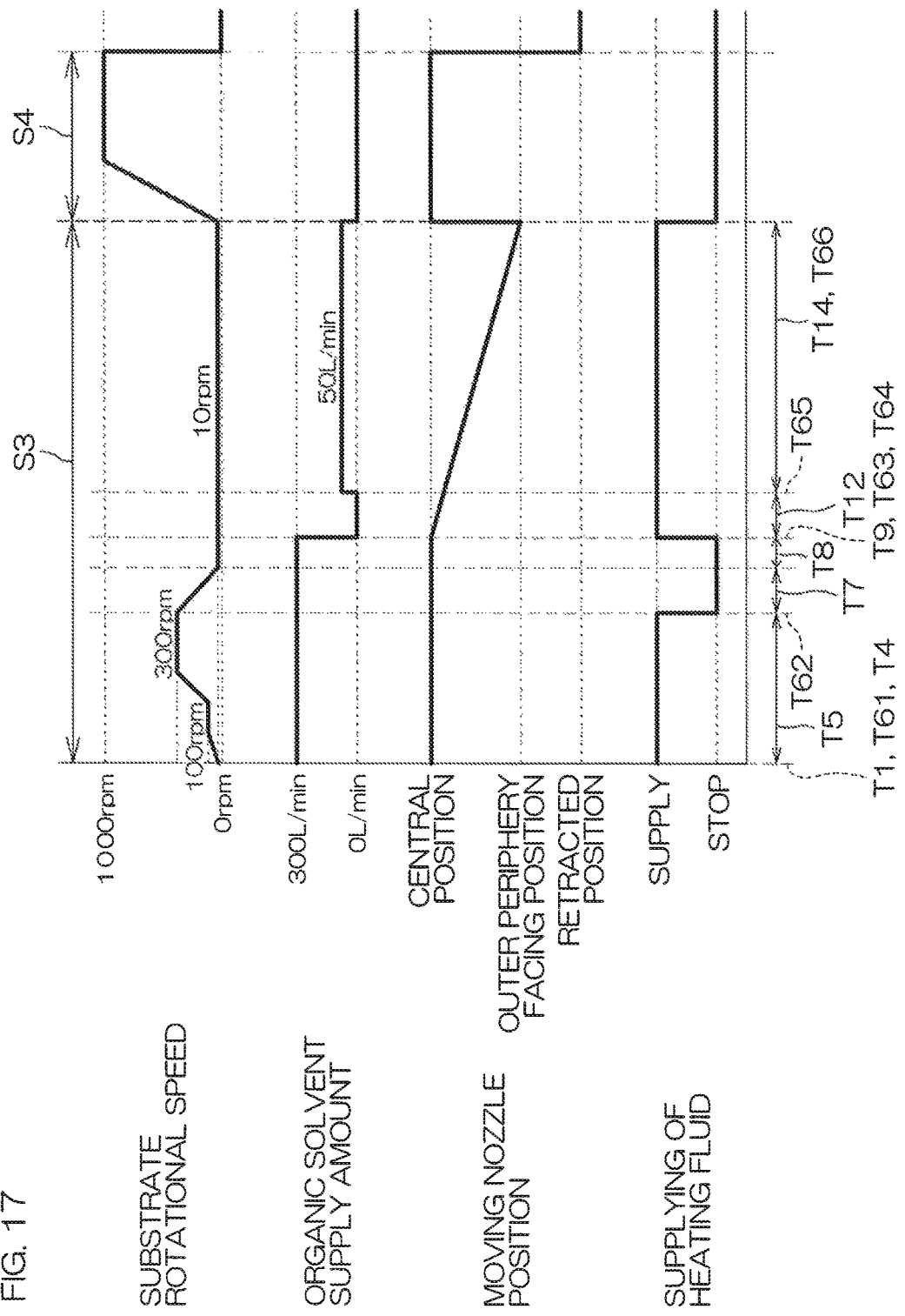
FIG. 17 is a time chart for describing the example of organic solvent processing performed by the processing unit according to the sixth preferred embodiment.

FIG. 16 is a flow diagram for describing conditions of organic solvent processing performed by the processing unit 2T according to the sixth preferred embodiment of the present invention. FIG. 17 is a time chart for describing an example of organic solvent processing performed by the processing unit 2T according to the sixth preferred embodiment. FIG. 18A to FIG. 18D are schematic sectional views for describing conditions of the organic solvent processing performed by the processing unit 2T according to the sixth preferred embodiment.

The organic solvent processing performed by the processing unit 2T according to the sixth preferred embodiment differs from the organic solvent processing performed by the processing unit 2 according to the first preferred embodiment (see FIG. 4) mainly in the following point. In the organic solvent processing performed by the processing unit 2T, the opening 67 is formed without using the inert gas. In the organic solvent processing performed by the processing unit 2T, in enlarging the opening 67, a liquid landing position P of the organic solvent is changed while supplying the organic solvent to the substrate W (see FIG. 18D). The liquid landing position P is a position at which the organic solvent supplied from the moving nozzle 10 lands on the front surface of the substrate W.

As in the organic solvent processing of the first preferred embodiment, in the organic solvent processing of the sixth preferred embodiment, first, the controller 12 controls the nozzle moving mechanism 60. The moving nozzle 10 is thereby disposed at the central position of facing the rotation center position of the front surface of the substrate W (step T1). Discharge of the inert gas toward the outer periphery of the substrate W is then started to form the inert gas flow F (step T2).

Figure 18A:
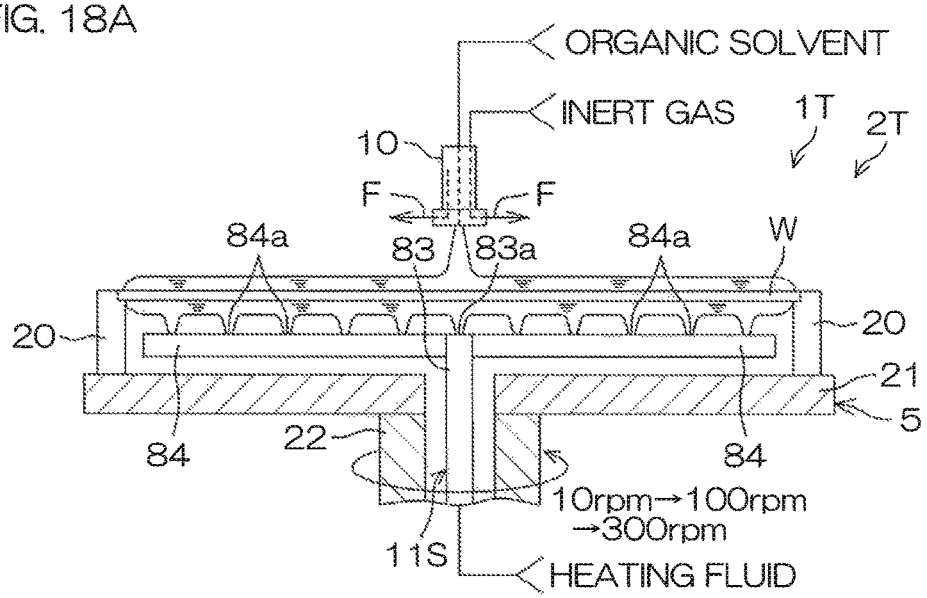
FIGS. 18A-18D are schematic sectional views for describing conditions of the organic solvent processing performed by the processing unit according to the sixth preferred embodiment.

The replacing step of replacing the rinse liquid by the organic solvent is then executed as shown in FIG. 18A. In detail, the controller 12 opens the heating fluid valve 81 to start the supplying of the heating fluid from the heating fluid supplying nozzle 11S (step T61). The heating fluid is discharged from the discharge port 83a toward the rear surface center of the substrate W in the rotating state and is discharged from the plurality of discharge ports 84a toward the plurality of outer peripheral positions of the rear surface of the substrate W. The temperature of the heating fluid supplied from the heating fluid supplying nozzle 11S (heating fluid temperature) is, for example, 80° C. to 85° C. A supply amount of the heating fluid supplied from the heating fluid supplying nozzle 11S (heating fluid supply amount) is, for example, 1800 milliliters/min.

The controller 12 then closes the rinse liquid valve 52 to stop the supplying of the rinse liquid from the rinse liquid supplying nozzle 8. The controller 12 then opens the organic solvent valve 62 to start the supplying of the organic solvent from the moving nozzle 10 (step T4). The organic solvent supplied from the moving nozzle 10 is discharged toward the central region, including the rotation center position of the front surface, of the substrate W. The temperature of the organic solvent supplied from the moving nozzle 10 is (organic solvent temperature), for example, 50° C. A supply amount of the organic solvent supplied from the moving nozzle 10 is (organic solvent supply amount), for example, 300 milliliters/min.

The controller 12 then makes the organic solvent be supplied from the moving nozzle 10 toward the substrate W while making the heating fluid be supplied from the heating fluid supplying nozzle 11S so that the substrate W is heated. The rinse liquid is thereby replaced by the organic solvent (step T5). In the replacing step, the controller 12 controls the substrate rotation driving mechanism 23 so that the spin base 21 rotates at a predetermined replacing speed. In the present example, the rotation of the substrate W in the replacing step is accelerated stepwise. More specifically, the rotational speed of the substrate W is increased from 10 rpm to 100 rpm, maintained thereat for a predetermined time, and thereafter increased to and maintained at 300 rpm for a predetermined time. The rotation of the substrate W in the replacing step is performed, for example, for a total of 71.5 seconds.

Figure 18B:
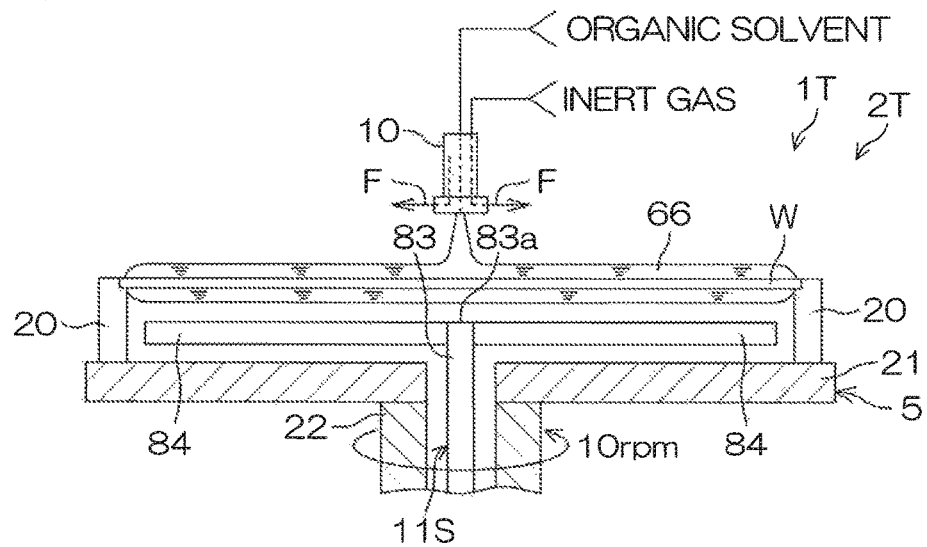

Then, as shown in FIG. 18B, a liquid film forming step of forming (performing liquid accumulation of) the liquid film 66 of the organic solvent on the front surface of the substrate W is executed. The controller 12 closes the heating fluid valve 81 to stop the supplying of the heating fluid to the center of the rear surface of the substrate W and the outer peripheral positions of the rear surface of the substrate W (step T62). Heating of the substrate W is thereby weakened.

The controller 12 then controls the substrate rotation driving mechanism 23 to gradually decelerate the rotation of the spin base 21 and the rotation of the substrate W is thereby decelerated in comparison to the replacing step (step T7). Specifically, the rotation of the substrate W is decelerated gradually until the substrate W rotates at a predetermined liquid film forming speed. The liquid film forming speed is, for example, 10 rpm.

The controller 12 then stops the supplying of the heating fluid from the heating fluid supplying nozzle 11 to the substrate W so that the heating of the substrate W is weakened and makes the organic solvent be supplied from the moving nozzle 10 to the front surface of the substrate W. The liquid film 66 of the organic solvent is thereby formed on the front surface of the substrate W (step T8). The liquid film 66 formed in the liquid film forming step has a predetermined thickness. The thickness is, for example, approximately 1 mm. The forming of the liquid film 66 is executed after the substrate W comes to rotate at the liquid film forming speed (low rotation liquid accumulating step).

The liquid film removing step of removing the liquid film 66 from the front surface of the substrate W by strengthening the heating of the substrate W without supplying the organic solvent to the central region of the substrate W is then executed.

Figure 18C:
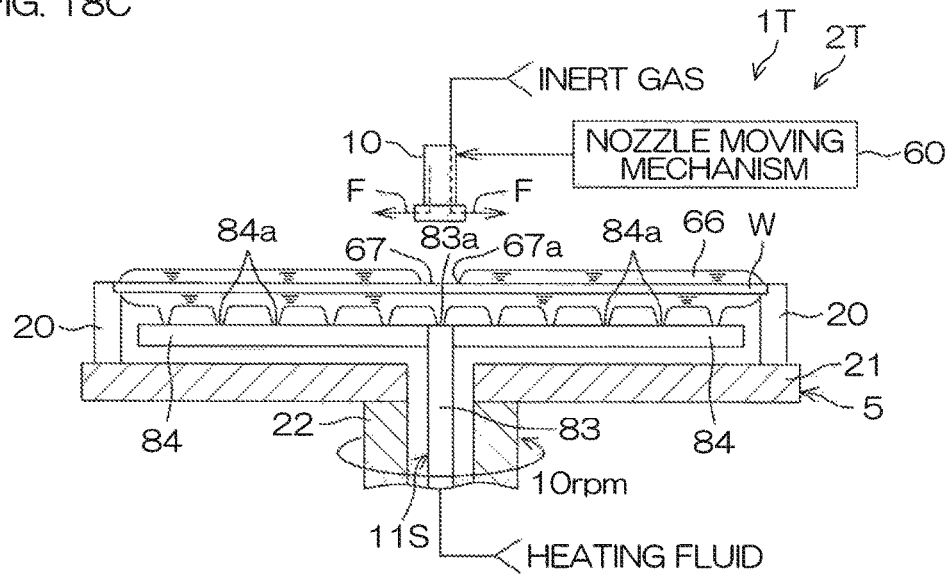

In detail, the controller 12 closes the organic solvent valve 62 to stop the supplying of the organic solvent from the moving nozzle 10 to the substrate W (step T9). The controller 12 then opens the heating fluid valve 81 to restart the supplying of the heating fluid from the heating fluid supplying nozzle 11S to the center of the rear surface of the substrate W and the outer peripheral positions of the rear surface of the substrate W as shown in FIG. 18C (step T63). The temperature of the heating fluid is, for example, 80° C. to 85° C. This temperature is higher than the temperature of the organic solvent (for example, of 50° C.) that was supplied from the moving nozzle 10. The heating of the substrate W is strengthened by the supplying of the heating fluid being restarted. Due to the strengthening of the heating, the temperature of the central region of the substrate W reaches 77° C. to 82° C. Due to the outer periphery of the substrate W being heated by the heating fluid supplied from the outer peripheral position heating fluid supplying nozzles 84, the temperature of the outer periphery of the substrate W reaches approximately 75° C.

The controller 12 then controls the nozzle moving mechanism 60 to start moving the moving nozzle 10, which is at the central position, to an outer periphery facing position (step T64). The outer periphery facing position is a position at which the moving nozzle 10 faces the outer periphery of the substrate W. In step T64, the nozzle moving mechanism 60 is included in the nozzle moving unit.

By the central region of the substrate W being heated, an opening forming step of forming the opening 67 in the central region of the liquid film 66 is executed (step T12).

Figure 18D:
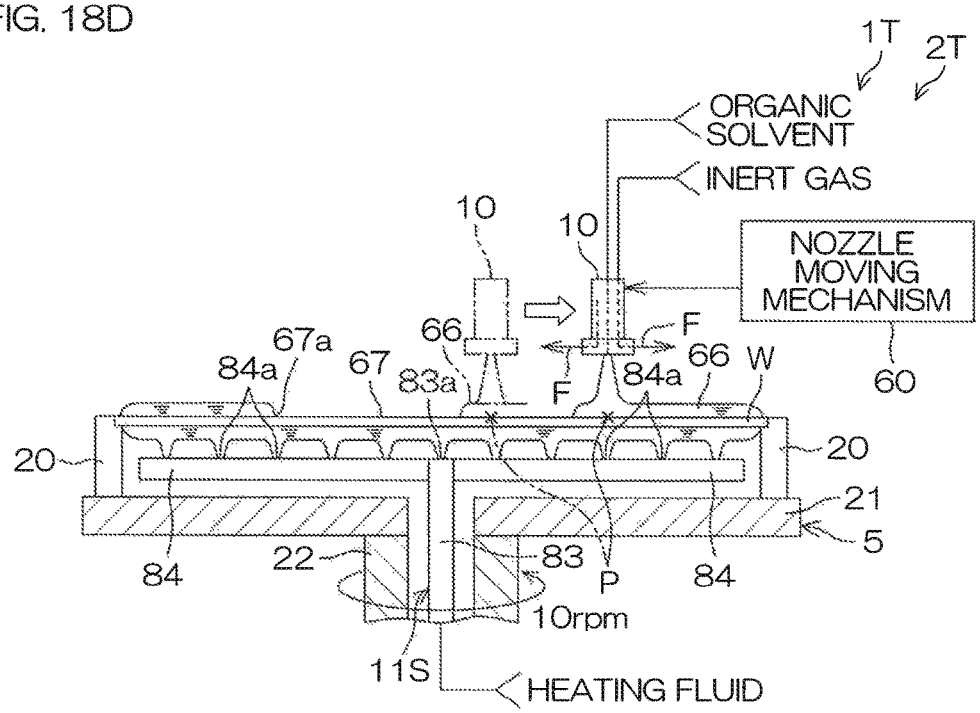

Then, as shown in FIG. 18D, the opening enlarging step of spreading the opening 67 toward the peripheral edge of the substrate W by sustaining the heating of the central region of the substrate W without supplying the organic solvent to the central region of the substrate W is executed (step T14).

Then, when the peripheral edge 67a of the opening 67 moves further outside than the central region of the substrate W, the controller 12 opens the organic solvent valve 62 to supply the organic solvent from the moving nozzle 10 to a portion of the substrate W further outside than the central region (step T65). The temperature (organic solvent temperature) of the organic solvent supplied from the moving nozzle 10 is, for example, 50° C. If the organic solvent temperature is not less than room temperature, the convection C (see FIG. 6A) is generated readily. If the organic solvent temperature is less than the temperature of the substrate W (for example, 75° C. to 82° C.), a temperature difference arises between the organic solvent at a vicinity of the front surface of the substrate W and the organic solvent at a vicinity of the front surface (upper side surface) of the liquid film 66. Due to this temperature difference, the convection C is generated readily. The supply amount (organic solvent supply amount) of the organic solvent supplied from the moving nozzle 10 is, for example, 50 milliliters/min.

In parallel to the opening enlarging step, the liquid landing position P of the organic solvent onto the substrate W is changed in accordance with the enlargement of the opening 67 (step T66). In detail, after the opening 67 is formed in the liquid film 66, the controller 12 controls the nozzle moving mechanism 60 to move the moving nozzle 10 in a direction along the front surface of the substrate W in accordance with the enlargement of the opening 67 so that the liquid landing position P is positioned further outside than the peripheral edge 67a of the opening 67. The liquid landing position P is thereby changed (nozzle moving step). The nozzle moving mechanism 60 is included in a liquid landing position changing unit that changes the liquid landing position P of the organic solvent on the front surface of the substrate W. A movement speed of the liquid landing position P in the rotational radius direction (liquid landing position movement speed) is, for example, 13 mm/s. This speed is substantially equal to a movement speed of the gas-liquid interface 66a of the liquid film 66 (see FIG. 6A). The nozzle moving mechanism 60 moves the moving nozzle 10 to the outer periphery facing position to move the liquid landing position P to the outer periphery of the substrate W. The controller 12 then closes the organic solvent valve 62 to stop the supplying of the organic solvent to the front surface of the substrate W.

By the opening 67 being enlarged and the liquid film 66 being removed from the front surface of the substrate W, the processing of the substrate W by the organic solvent is ended.

With the sixth preferred embodiment, the same effects as those of the fifth preferred embodiment are exhibited.

With the sixth preferred embodiment, the liquid landing position P of the organic solvent is changed in accordance with the enlargement of the opening 67. The organic solvent is thus sufficiently supplied further outside than the peripheral edge 67a of the opening 67. Splitting of the liquid film 66 due to localized evaporation of the organic solvent further outside than the peripheral edge 67a of the opening 67 can thus be suppressed. The organic solvent on the front surface of the substrate W can thus be removed even more satisfactorily.

With the sixth preferred embodiment, the opening 67 can be formed without using the inert gas by using the heating fluid supplying nozzle 11S as the simple mechanism.

Seventh Preferred Embodiment

Figure 19:
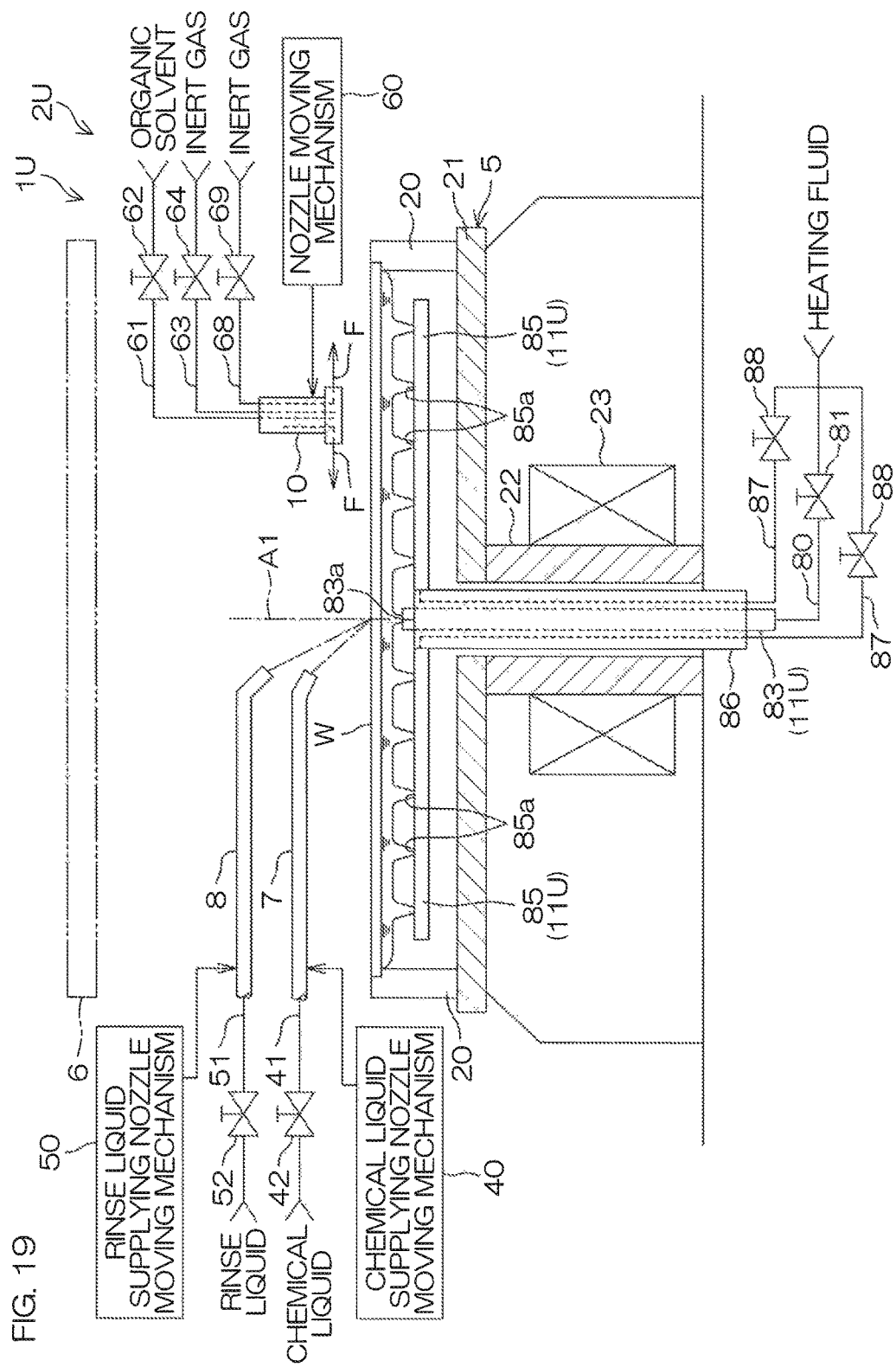
FIG. 19 is a schematic sectional view for describing an arrangement example of a processing unit included in a substrate processing apparatus according to a seventh preferred embodiment of the present invention.

FIG. 19 is a schematic sectional view for describing an arrangement example of a processing unit 2U included in a substrate processing apparatus 1U according to a seventh preferred embodiment. The processing unit 2U includes a heating fluid supplying nozzle 11U. The heating fluid supplying nozzle 11U is included in the substrate heating unit. The heating fluid supplying nozzle 11U includes the center heating fluid supplying nozzle 83, and outer peripheral position heating fluid supplying nozzles 85 that are provided as separate members from the center heating fluid supplying nozzle 83. The outer peripheral position heating fluid supplying nozzles 85 are included in the outer peripheral portion heating unit.

In detail, the outer peripheral position heating fluid supplying nozzles 85 have forms of bar nozzles extending in radial directions from a tip of a hollow supporting member 86 that surrounds the center heating fluid supplying nozzle 83 and extends in the vertical direction. The outer peripheral position heating fluid supplying nozzle 85 has a plurality of discharge ports 85a facing outer peripheral positions separated from the center of the rear surface of the substrate W.

A plurality of the outer peripheral position heating fluid supplying nozzles 85 may be provided. Two outer peripheral position heating fluid supplying nozzles 85 are provided in the seventh preferred embodiment. The two outer peripheral position heating fluid supplying nozzles 85 are separated from each other by 180 degrees in regard to a rotation direction of the substrate W. The respective outer peripheral position heating fluid supplying nozzles 85 are respectively coupled to a plurality of heating fluid supply pipes 87 that are separate from the heating fluid supply pipe 80 coupled to the center heating fluid supplying nozzle 83. A plurality of heating fluid valves 88 are respectively interposed in the plurality of heating fluid supply pipes 87. In other words, an individual heating fluid supply pipe 87 is coupled to each outer peripheral position heating fluid supplying nozzle 85, and a single heating fluid valve 88 is interposed in each heating fluid supply pipe 87. The heating fluid from a heating fluid supply source in common may be supplied to the heating fluid supply pipe 80 and the heating fluid supply pipes 87.

The controller 12 is capable of switching between supplying of the heating fluid by the center heating fluid supplying nozzle 83 and supplying of the heating fluid by the outer peripheral position heating fluid supplying nozzles 85 by controlling the heating fluid valves 81 and 88.

Figure 20:
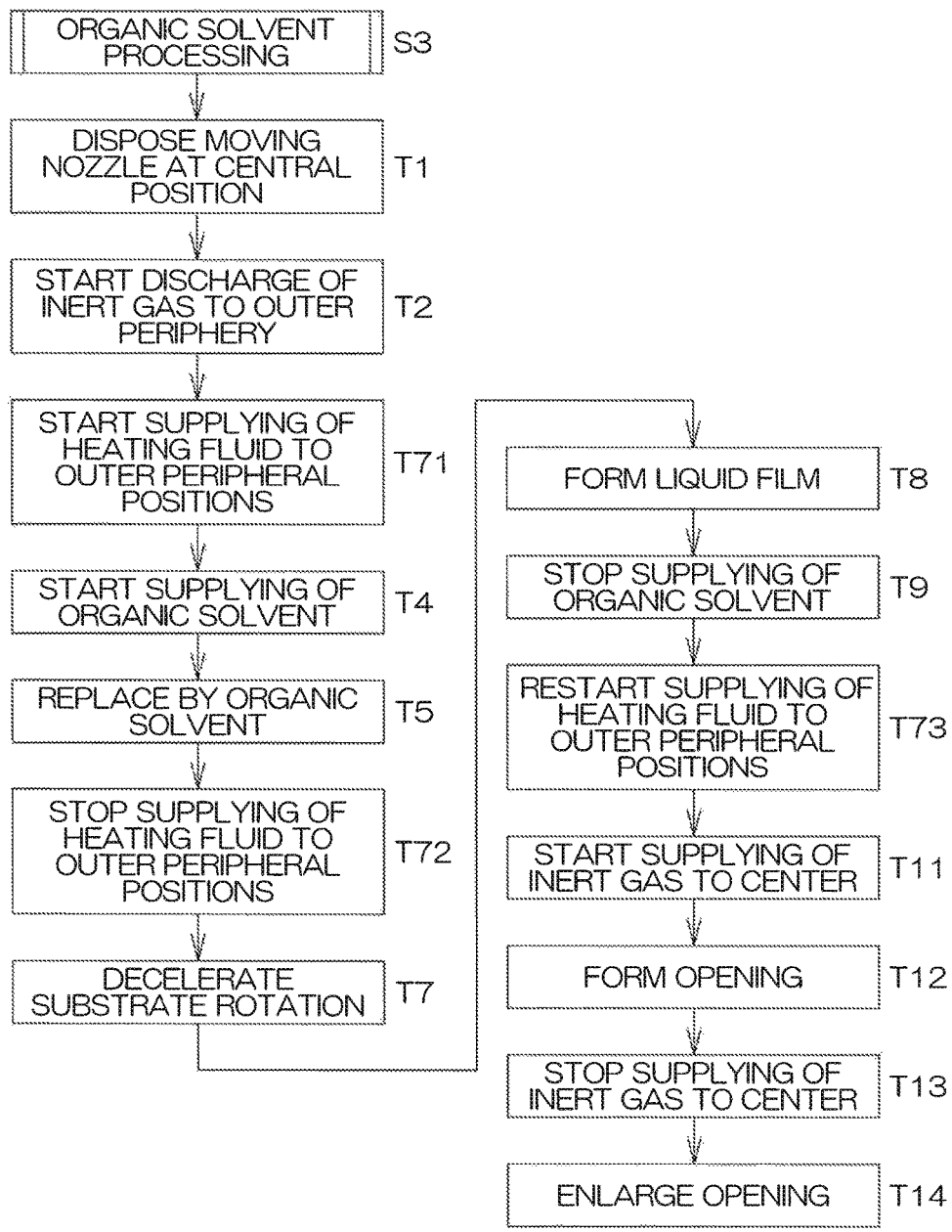
FIG. 20 is a flow diagram for describing an example of organic solvent processing performed by the processing unit according to the seventh preferred embodiment.
Figure 21A:
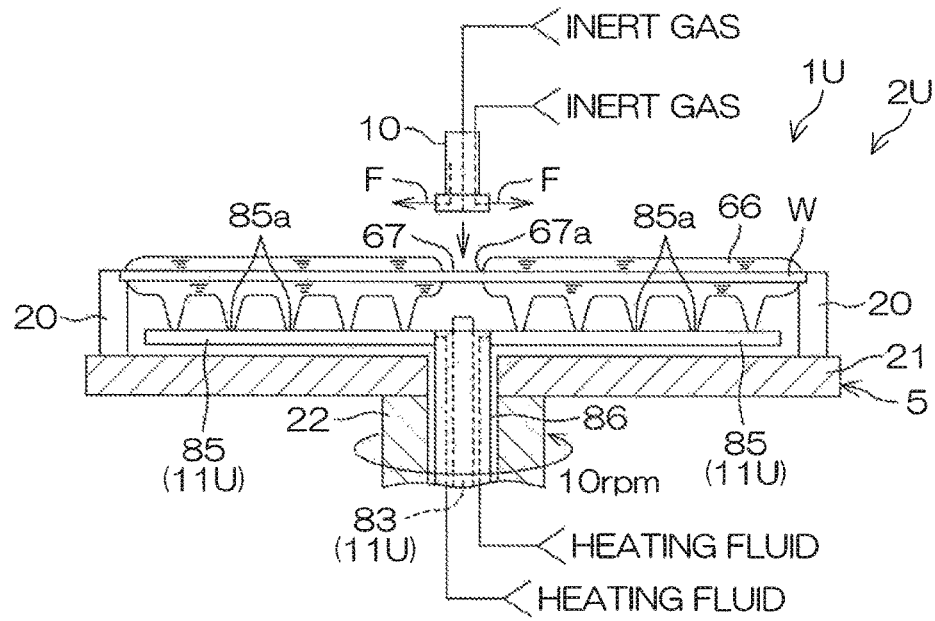
FIGS. 21A-21B are schematic sectional views for describing conditions of the opening forming step in the organic solvent processing performed by the processing unit according to the seventh preferred embodiment.
Figure 21B:
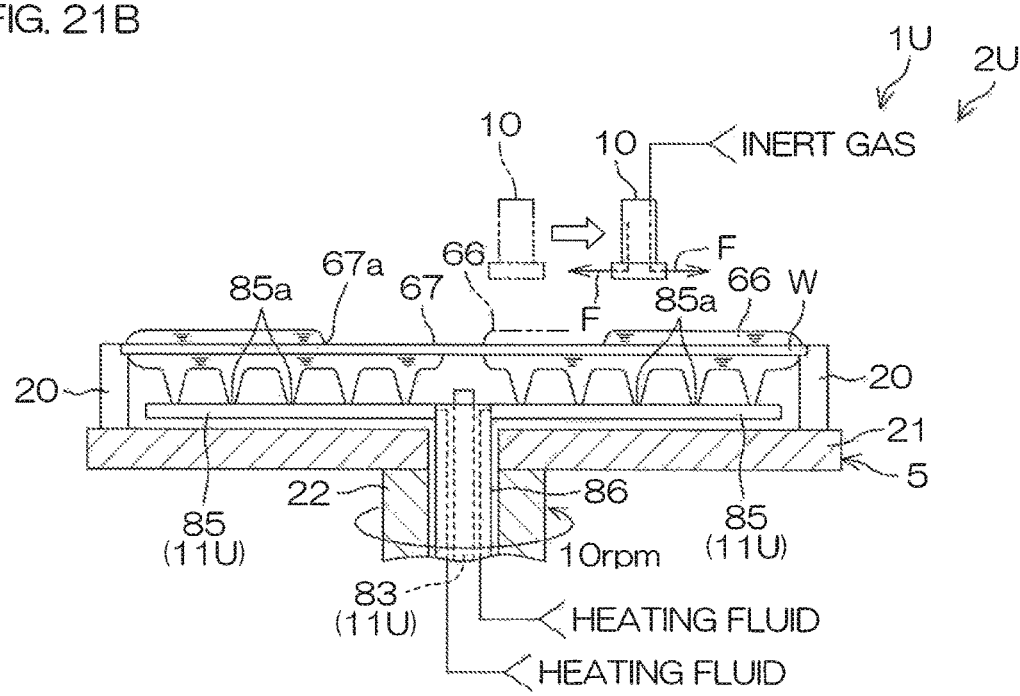

FIG. 20 is a flow diagram for describing an example of organic solvent processing performed by the processing unit 2U according to the seventh preferred embodiment. FIG. 21A is a schematic sectional view for describing conditions of the opening forming step in the organic solvent processing performed by the processing unit 2U according to the seventh preferred embodiment. FIG. 21B is a schematic sectional view for describing conditions of the opening enlarging step in the organic solvent processing performed by the processing unit 2U according to the seventh preferred embodiment.

The organic solvent processing performed by the processing unit 2U according to the seventh preferred embodiment differs from the organic solvent processing performed by the processing unit 2 according to the first preferred embodiment (see FIG. 4) in the following point. In the organic solvent processing performed by the processing unit 2U, the supplying of the heating fluid toward the center of the rear surface of the substrate W by the center heating fluid supplying nozzle 83 is not performed and just the supplying of the heating fluid toward the outer peripheral positions of the rear surface of the substrate W by the outer peripheral position heating fluid supplying nozzles 85 is performed.

In detail, in the organic solvent processing performed by the processing unit 2U, instead of starting the supplying of the heating fluid to the center of the rear surface of the substrate W (step T3 of FIG. 4), the controller 12 opens the heating fluid valves 88 to start the supplying of the heating fluid toward the outer peripheral positions of the rear surface of the substrate W from the outer peripheral position heating fluid supplying nozzles 85 (step T71).

Also in the organic solvent processing performed by the processing unit 2U, instead of stopping the supplying of the heating fluid to the center of the rear surface of the substrate W (step T6 of FIG. 4), the controller 12 closes the heating fluid valves 88 to stop the supplying of the heating fluid toward the outer peripheral positions of the rear surface of the substrate W from the outer peripheral position heating fluid supplying nozzles 85 (step T72).

Also in the organic solvent processing performed by the processing unit 2U, instead of restarting the supplying of the heating fluid to the center of the rear surface of the substrate W (step T10 of FIG. 4), the controller 12 opens the heating fluid valves 88 to restart the supplying of the heating fluid toward the outer peripheral positions of the rear surface of the substrate W from the outer peripheral position heating fluid supplying nozzles 85 (step T73).

Also, as shown in FIG. 21A, in the organic solvent processing performed by the processing unit 2U, the controller 12 opens the first inert gas valve 64 to supply the inert gas from the moving nozzle 10 to the center of the substrate W (step T11). In the organic solvent processing of the seventh preferred embodiment, the opening 67 is formed in the liquid film 66 on the substrate W by the supplying of the inert gas.

Then, as shown in FIG. 21B, in the opening enlarging step, the substrate W is heated at the outer peripheral positions by the supplying of the heating fluid from the outer peripheral position heating fluid supplying nozzles 85 to the outer peripheral positions of the rear surface of the substrate W.

With the seventh preferred embodiment, the similar effects as those of the first preferred embodiment are exhibited.

With the seventh preferred embodiment, the evaporation of the organic solvent at the outer peripheral positions is accelerated by the substrate W being heated at the outer peripheral positions to which the heating fluid from the heating fluid supplying nozzle 11S is supplied. The liquid film 66 can thereby be removed efficiently.

Also with the organic solvent processing of the seventh preferred embodiment, the controller 12 may cause the center heating fluid supplying nozzle 83 to supply the heating fluid to the center of the rear surface of the substrate W so that heating of the center of the substrate W is aided.

The present invention is not restricted to the preferred embodiments described above and may be implemented in yet other modes.

For example, if the liquid film 66 cannot be removed completely due to insufficient heating of the outer periphery of the substrate W, the controller 12 may control the substrate rotation driving mechanism 23 to gradually accelerate the rotation of the substrate W before the drying processing step. The liquid film 66 is thereby removed. The rotation of the substrate W is, for example, accelerated stepwise. More specifically, the rotational speed of the substrate W is increased from 10 rpm to 20 rpm, maintained thereat for a predetermined time (for example, 10 seconds), thereafter increased to and maintained at 30 rpm for a predetermined time (for example, 10 seconds), thereafter increased to and maintained at 40 rpm for a predetermined time (for example, 10 seconds), and thereafter increased to and maintained at 500 rpm for a predetermined time (for example, 10 seconds).

Also, if the liquid film 66 cannot be removed completely due to insufficient heating of the outer periphery of the substrate W, the controller 12 may open the first inert gas valve 64 to supply the inert gas from the moving nozzle 10 to the peripheral edge 67a of the opening 67 before the drying processing step. A flow rate of the inert gas in this process is, for example, 50 liters/min.

Also, although it was stated that step T6, T52, T62, or T72 of stopping the supplying of the heating fluid is executed in the liquid film forming step in the organic solvent processing of each preferred embodiment, there is no need to stop the supplying of the heating fluid completely. That is, the controller 12 may control the heating fluid valve 81 or 88 to reduce the supply amount of the heating fluid to thereby weaken the heating of the substrate W. Or, the controller 12 may lower the temperature of the heating fluid to weaken the heating of the substrate W.

If the heating of the substrate W is weakened by reducing the supply amount of the heating fluid, the controller 12 controls the heating fluid valve 81 or 88 to increase the supply amount of the heating fluid. The heating of the substrate W is thereby strengthened. Also, if the heating of the substrate W is weakened by lowering the temperature of the heating fluid in the liquid film forming step, the controller 12 controls the heating fluid valve 81 or 88 to raise the temperature of the heating fluid. The heating of the substrate W is thereby strengthened.

Also, although step T13 is executed in the organic solvent processing of the first preferred embodiment to the fifth preferred embodiment and the seventh preferred embodiment, there is no need to stop the downward supplying of the inert gas completely. That is, the controller 12 may control the first inert gas valve 64 to reduce the flow rate of the inert gas supplied from the moving nozzle 10.

The present application corresponds to Japanese Patent Application No. 2015-255046 filed in the Japan Patent Office on Dec. 25, 2015, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method comprising:
    a processing liquid supplying step of supplying a processing liquid which contains water, to a horizontally held substrate;
    a replacing step of replacing the processing liquid by supplying a low surface tension liquid, having a surface tension lower than water, to the substrate while heating the substrate by supplying a hot water to a rear surface center of the substrate;
    a liquid film forming step of forming a liquid film of the low surface tension liquid which has the surface tension lower than water, on a front surface of the substrate, by stopping the hot water supply to weaken the heating of the substrate and supplying the low surface tension liquid to the substrate;
    a liquid film removing step of removing the liquid film on the substrate by supplying the hot water to the rear surface center of the substrate to strengthen the heating of the substrate without supplying the low surface tension liquid to a central region of the substrate, so that the liquid film moves on the front of the substrate with being in contact with the front surface; and
    a substrate rotating step of rotating the substrate around a predetermined rotational axis oriented along a vertical direction in the replacing step, decelerating the rotation of the substrate around the rotational axis in the liquid film forming step, and rotating around the rotational axis in the liquid film removing step at a lower speed than a rotational speed in the replacing step.

2. The substrate processing method according to claim 1, wherein,
    in the liquid film removing step, heating the substrate generates a convection inside the liquid film of the low surface tension liquid having the surface tension lower than water to remove the liquid film from the front surface of the substrate by movement of the liquid film due to the convection.

3. The substrate processing method according to claim 1, wherein the liquid film removing step includes an opening forming step of forming an opening in a central region of the liquid film of the low surface tension liquid and an opening enlarging step of heating the substrate so that a convection in a direction away from the substrate is generated at a gas-liquid interface of the liquid film positioned at a peripheral edge of the opening and touching the front surface of the substrate, thereby spreading the opening to a peripheral edge of the substrate.

4. The substrate processing method according to claim 3, further comprising: a liquid landing position changing step of performing, in parallel to the opening enlarging step, supplying of the low surface tension liquid, having the surface tension lower than water, to a liquid landing position set further outside than the peripheral edge of the opening on the front surface of the substrate and changing of the liquid landing position in accordance with the enlargement of the opening.

5. The substrate processing method according to claim 1, wherein, in the liquid film removing step, the substrate is heated and rotated so that a movement speed of the liquid film due to the convection inside the liquid film is higher than a movement speed of the liquid film due to a centrifugal force acting on the liquid film.

6. The substrate processing method according to claim 1, wherein, by the substrate rotating step in the liquid film removing step, the rotational speed of the substrate is maintained fixed or the rotational speed of the substrate is changed within a speed range in which the liquid film does not split on the substrate.

7. The substrate processing method according to claim 1, wherein the low surface tension liquid is isopropyl alcohol, and the hot water of 80° C. to 85° C. is supplied to the rear surface center of the substrate, in the liquid film removing step, so that a temperature of the central region of the substrate reaches 77° C. to 82° C.

8. The substrate processing method according to claim 3, wherein, in the opening forming step, the hot water is supplied to the rear surface center to thin the liquid film of the low surface tension liquid only in the central region of the substrate.

9. The substrate processing method according to claim 8, wherein, in the opening forming step, an inert gas is supplied toward a central region of the liquid film of the low surface tension liquid so as to assist the formation of the opening in the central region of the liquid film of the low surface tension liquid.

10. The substrate processing method according to claim 9, wherein the opening enlarging step is performed with the inert gas supply being stopped.

* * * * *

UNITED STATES PATENT AND TRADEMARK OFFICE
CERTIFICATE OF CORRECTION

PATENT NO. : 10,224,198 B2
APPLICATION NO. : 15/388311
DATED : March 5, 2019
INVENTOR(S) : Tetsuya Emoto, Atsuro Eitoku and Tomomi Iwata Page 1 of 1

It is certified that error appears in the above-identified patent and that said Letters Patent is hereby corrected as shown below:

In the Claims
Claim 1 at Column 32, Line 41, insert --the substrate-- before "around the rotational".

Signed and Sealed this
Twenty-seventh Day of August, 2019

Andrei Iancu
*Director of the United States Patent and Trademark Office*